(12) United States Patent
Oguri et al.

(10) Patent No.: US 9,385,151 B2
(45) Date of Patent: Jul. 5, 2016

(54) MANUFACTURING METHOD FOR EDGE ILLUMINATED TYPE PHOTODIODE AND SEMICONDUCTOR WAFER

(71) Applicant: HAMAMATSU PHOTONICS K.K., Hamamatsu-shi, Shizuoka (JP)

(72) Inventors: Hiroshi Oguri, Hamamatsu (JP); Yoshitaka Ishikawa, Hamamatsu (JP); Akira Sakamoto, Hamamatsu (JP); Tomoya Taguchi, Hamamatsu (JP); Yoshimaro Fujii, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/627,238

(22) Filed: Feb. 20, 2015

(65) Prior Publication Data
US 2015/0171127 A1 Jun. 18, 2015

Related U.S. Application Data

(62) Division of application No. 14/012,273, filed on Aug. 28, 2013, now Pat. No. 8,993,361.

(60) Provisional application No. 61/694,921, filed on Aug. 30, 2012.

(30) Foreign Application Priority Data

Aug. 30, 2012 (JP) ................... 2012-189402

(51) Int. Cl.
*H01L 27/148* (2006.01)
*H01L 29/768* (2006.01)
(Continued)

(52) U.S. Cl.
CPC ...... *H01L 27/14632* (2013.01); *H01L 27/1446* (2013.01); *H01L 27/1463* (2013.01);
(Continued)

(58) Field of Classification Search
CPC ............ H01L 25/167; H01L 27/14643; H01L 27/3227
USPC .................................................. 257/233, 292
See application file for complete search history.

(56) References Cited

U.S. PATENT DOCUMENTS 7,112,465 B2 * 9/2006 Goushcha ........... H01L 27/1464
257/443
2013/0113064 A1 5/2013 Okamoto et al.

FOREIGN PATENT DOCUMENTS

| JP | 8-18151 A | 1/1996 |
| JP | 2007-207990 | 8/2007 |

(Continued)

*Primary Examiner* — Hoai V Pham
(74) *Attorney, Agent, or Firm* — Drinker Biddle & Reath LLP

(57) ABSTRACT

A manufacturing method for an edge illuminated type photodiode has: a process of forming an impurity-doped layer of a first conductivity type in each of device forming regions in a semiconductor substrate; a process of forming an impurity-doped layer of a second conductivity type in each of the device forming regions; a process of forming a trench extending in a direction of thickness of the semiconductor substrate from a principal surface, at a position of a boundary between adjacent device forming regions, by etching to expose side faces of the device forming regions; a process of forming an insulating film on the exposed side faces of the device forming regions; a process of forming an electrode for each corresponding impurity-doped layer on the principal surface side of the semiconductor substrate; and a process of implementing singulation of the semiconductor substrate into the individual device forming regions.

3 Claims, 29 Drawing Sheets

(51) Int. Cl.
  H01L 27/146    (2006.01)
  H01L 27/144    (2006.01)
  H01L 31/0232   (2014.01)
  H01L 31/0224   (2006.01)
  H01L 31/0352   (2006.01)
  H01L 31/103    (2006.01)
  H01L 31/18     (2006.01)
(52) U.S. Cl.
  CPC .... *H01L27/14603* (2013.01); *H01L 31/02327* (2013.01); *H01L 31/022408* (2013.01); *H01L 31/0352* (2013.01); *H01L 31/03529* (2013.01); *H01L 31/103* (2013.01); *H01L 31/18* (2013.01); *Y02E 10/50* (2013.01)

(56)  References Cited

FOREIGN PATENT DOCUMENTS

JP  2009-135342       6/2009
JP  2009-212109  A    9/2009
WO  WO 2004/008548    1/2004

* cited by examiner

Fig.13
(a)
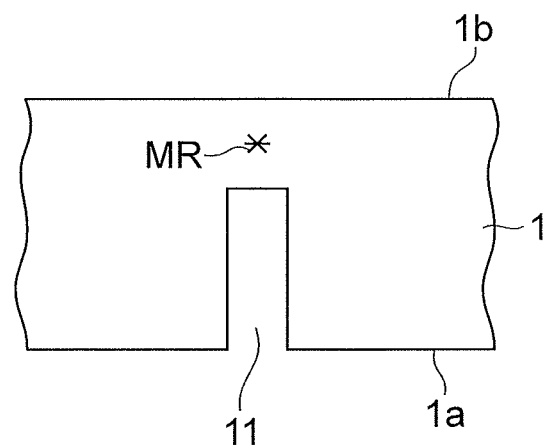
(b)
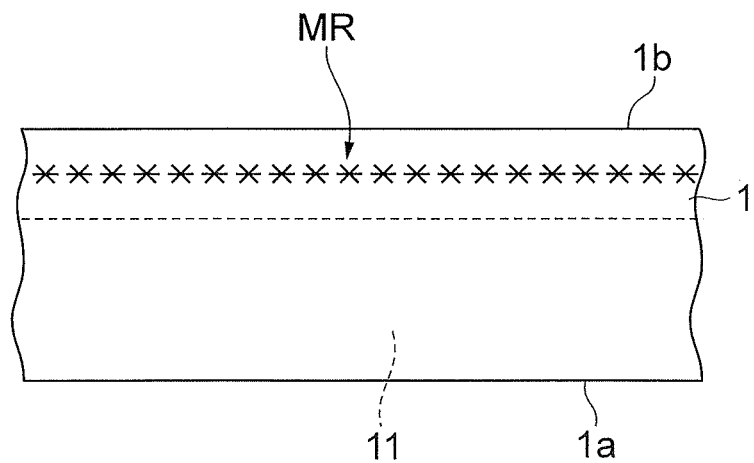

MANUFACTURING METHOD FOR EDGE ILLUMINATED TYPE PHOTODIODE AND SEMICONDUCTOR WAFER

CROSS-REFERENCE TO RELATED APPLICATIONS

This is a divisional application of copending application Ser. No. 14/012,273, having a filing date of Aug. 28, 2013, which is a non-provisional of 61/694,921 having a filing date of Aug. 30, 2012. The copending application Ser. No. 14/012,273 is incorporated by reference herein in its entirety.

BACKGROUND OF THE INVENTION

1. Field of the Invention

The present invention relates to a manufacturing method for an edge illuminated type photodiode, and a semiconductor wafer for obtaining the edge illuminated type photodiode.

2. Related Background Art

There are known edge illuminated type photodiodes in which a side face extending between a pair of principal faces opposed to each other serves as a light incident surface (e.g., cf. Japanese Patent Applications Laid-open No. H08-018151 and No. 2009-212109).

SUMMARY OF THE INVENTION

The photodiodes described in the foregoing Applications have the problem that it is hard for them to detect light in a relatively short wavelength region (e.g., the wavelength region of not more than 900 nm).

In the case of the photodiode described in Japanese Patent Application Laid-open No. H08-018151, since the side face serving as a light incident surface (light receiving surface) is a surface formed by dicing, the surface is rough and has many lattice defects. When the light in the relatively short wavelength region is incident through the side face into this photodiode, the incident light is absorbed in a region near the side face (e.g., a region in the range from the side face to ten and several μm in the case where the wavelength of light is 830 nm) to generate carriers. However, since the carriers are generated in the region near the side face, the generated carriers are trapped by the lattice defects of the side face to undergo recombination and extinction, making no contribution to output. This is also the case with the photodiode described in Japanese Patent Application Laid-open No. 2009-212109. Therefore, it is difficult for the photodiodes described in the above Applications to detect the light in the relatively short wavelength region.

As described above, the surface of the side face, if formed by dicing, is very rough, and the side face and the region near the side face in the photodiode tend to have defects. In the presence of the defects, recombination of generated carriers is likely to occur with the defects serving as starting points.

An object of the present invention is to provide a manufacturing method for an edge illuminated type photodiode capable of detecting the light in the relatively short wavelength region. Another object of the present invention is to provide a semiconductor wafer for obtaining the edge illuminated type photodiode capable of detecting the light in the relatively short wavelength region.

An aspect of the present invention is a manufacturing method for an edge illuminated type photodiode, the method comprising: a process of preparing a semiconductor substrate including a plurality of device forming regions and having first and second principal surfaces opposed to each other; a process of forming an impurity-doped layer of a first conductivity type in each of the device forming regions in the semiconductor substrate; a process of forming an impurity-doped layer of a second conductivity type in each of the device forming regions in the semiconductor substrate; a process of forming a trench extending in a direction of thickness of the semiconductor substrate from the first principal surface, at a position of a boundary between adjacent device forming regions out of the plurality of device forming regions, by etching to expose side faces of the device forming regions; a process of forming an insulating film on the exposed side faces of the device forming regions; a process of forming an electrode for each corresponding impurity-doped layer, on the first principal surface side of the semiconductor substrate; and a process of implementing singulation of the semiconductor substrate into the individual device forming regions.

In the manufacturing method of the present invention, the trench extending in the direction of thickness of the semiconductor substrate from the first principal surface is formed at the position of the boundary between adjacent device forming regions out of the plurality of device forming regions, by etching to expose the side faces of the device forming regions. Then the insulating film is formed on the exposed side faces of the device forming regions and thereafter the singulation of the semiconductor substrate into the individual device forming regions is implemented. This process results in obtaining the edge illuminated type photodiode comprising the semiconductor substrate in which the impurity-doped layer of the first conductivity type and the impurity-doped layer of the second conductivity type are formed (a substrate portion corresponding to the device forming region), the electrodes connected to the corresponding impurity-doped layers, and the insulating film formed on the side face. In this edge illuminated type photodiode, since the side face is formed by etching, the surface thereof is extremely smoother than the surface formed by dicing.

When the light in the relatively short wavelength region is incident through the side face into the edge illuminated type photodiode obtained by the present invention, the incident light is absorbed in the region near the side face to generate carriers. Since the side face serving as an incident surface (light receiving surface) is smooth, the carriers are less likely to be trapped in the side face (and the region near the side face), suppressing recombination of the generated carriers. Therefore, the generated carriers are prevented from undergoing extinction and thus make efficient contribution to output of the photodiode. As a result, the edge illuminated type photodiode obtained by the present invention can successfully detect the light in the relatively short wavelength region.

In the edge illuminated type photodiode obtained by the present invention, since the insulating film covers the side face of the semiconductor substrate after the singulation, i.e., the light incident surface of the photodiode, the insulating film protects this light incident surface. Therefore, it is feasible to certainly suppress the recombination of generated carriers.

The process of forming the insulating film may comprise forming an antireflection film as the insulating film. In this case, since the antireflection film reduces reflection, the majority of light incident through the side face into the photodiode reaches an internal portion of the photodiode, without being reflected by the side face (the light incident surface of the photodiode). This improves photosensitivity of the photodiode.

The process of implementing the singulation of the semiconductor substrate may comprise: applying a laser light with a light-converging point at an internal portion of the semiconductor substrate from the second principal surface side, thereby to form modified regions as starting points of cutting in the internal portion of the semiconductor substrate, along an intended cutting line located at a boundary between adjacent device forming regions out of the plurality of device forming regions; and cutting the semiconductor substrate with the modified regions serving as the starting points, to implement the singulation. In this case, the modified regions formed along the intended cutting line constitute cutting start regions. Since the semiconductor substrate is cut by application of the laser light, the semiconductor substrate can be cut in a shorter time than by a cutting method using blade dicing. Since the semiconductor substrate is cut by dividing it along the cutting start regions by a relatively small force, generation of dust is kept at an extremely low level, eliminating a need for a cleaning process. Since the semiconductor substrate can be cut by dividing it along the cutting start regions by a relatively small force, the cut surface can be made smoother than that by the method using blade dicing. As a consequence of these, the productivity of photodiode can be further improved.

The internal portion of the semiconductor substrate herein has meanings including an area on the front surface (second principal surface) of the semiconductor substrate as well. The light-converging point refers to a point where the laser light is converged. The cutting start regions are formed by forming the modified regions continuously in certain cases, and are also formed by forming the modified regions intermittently in some cases.

The process to expose the side faces of the device forming regions may comprise: forming the trench so as to extend in a direction perpendicular to a first direction, at a position of a boundary between device forming regions adjacent to each other in the first direction out of the plurality of device forming regions, while forming no trench at a position of a boundary between device forming regions adjacent to each other in a second direction intersecting with the first direction out of the plurality of device forming regions. In this case, since the device forming regions adjacent to each other in the second direction out of the device forming regions are continuous to each other, the mechanical strength of the semiconductor substrate is ensured even in a state in which the trench is formed at the position of the boundary between the device forming regions adjacent to each other in the first direction out of the device forming regions. Therefore, it becomes easier to handle the semiconductor substrate and feasible to prevent deformation and damage of the semiconductor substrate.

The trench may be formed for each corresponding device forming region so as to be physically separated from other trenches. In this case, the mechanical strength of the semiconductor substrate in which the trenches are formed is further ensured. Therefore, it becomes extremely easier to handle the semiconductor substrate and feasible to securely prevent the deformation and damage of the semiconductor substrate.

The process to expose the side faces of the device forming regions may be carried out after the process of forming the impurity-doped layer of the first conductivity type and the process of forming the impurity-doped layer of the second conductivity type.

The process to expose the side faces of the device forming regions may be carried out before the process of forming the impurity-doped layer of the first conductivity type; the process to expose the side faces of the device forming regions may comprise: forming the trench so as to extend in a direction perpendicular to a first direction, at a position of a boundary between device forming regions adjacent to each other in the first direction out of the plurality of device forming regions; and forming the trench so as to extend in a direction perpendicular to a second direction, at a position of a boundary between device forming regions adjacent to each other in the second direction intersecting with the first direction out of the plurality of device forming regions, so that the trench formed so as to extend in the direction perpendicular to the first direction intersects with and is continuous to the trench formed so as to extend in the direction perpendicular to the second direction; the process of forming the impurity-doped layer of the first conductivity type may comprise forming the impurity-doped layer of the first conductivity type across a face exposed in the trench formed so as to extend in the direction perpendicular to the first direction and across a face exposed in the trench formed so as to extend in the direction perpendicular to the second direction, in the device forming region. In this case, the impurity-doped layer of the first conductivity type is formed across the faces (side faces) exposed in the respective trenches in the device forming region. This prevents the pn junction from being exposed and thus suppresses generation of noise.

The semiconductor substrate may be a semiconductor wafer.

Another aspect of the present invention is a semiconductor wafer including a plurality of device forming regions and having first and second principal surfaces opposed to each other, the semiconductor wafer comprising: an impurity-doped layer of a first conductivity type formed in each of the device forming regions; an impurity-doped layer of a second conductivity type formed in each of the device forming regions; and an electrode formed corresponding to each impurity-doped layer, on the first principal surface side of the semiconductor wafer, wherein a trench extending in a direction of thickness of the semiconductor wafer from the first principal surface is formed by etching, at a position of a boundary between adjacent device forming regions out of the plurality of device forming regions, so as to expose side faces of the device forming regions, and wherein an insulating film is formed on the exposed side faces of the device forming regions.

The singulation of the semiconductor wafer of the present invention into the device forming regions results in obtaining the edge illuminated type photodiode comprising the semiconductor substrate in which the impurity-doped layer of the first conductivity type and the impurity-doped layer of the second conductivity type are formed (a substrate portion corresponding to the device forming region), the electrodes connected to the corresponding impurity-doped layers, and the insulating film formed on the side face. The edge illuminated type photodiode obtained from the semiconductor wafer of the present invention can successfully detect the light in the relatively short wavelength region, as described above.

In the edge illuminated type photodiode obtained from the semiconductor wafer of the present invention, since the insulating film covers the side face of the semiconductor wafer after the singulation, i.e., the light incident surface, the light incident surface is protected by the insulating film. Therefore, the recombination of generated carriers is surely suppressed.

The trench may be formed so as to extend in a direction perpendicular to a first direction, at a position of a boundary between device forming regions adjacent to each other in the first direction out of the plurality of device forming regions, and no trench may be formed at a position of a boundary between device forming regions adjacent to each other in a second direction intersecting with the first direction out of the plurality of device forming regions. In this case, since the device forming regions adjacent to each other in the second direction out of the device forming regions are continuous to each other, the mechanical strength of the semiconductor wafer is ensured even in a state in which the trench is formed at the position of the boundary between the device forming regions adjacent to each other in the first direction out of the device forming regions. Therefore, it becomes easier to handle the semiconductor wafer and feasible to prevent deformation and damage of the semiconductor wafer.

The trench may be formed for each corresponding device forming region so as to be physically separated from other trenches. In this case, the mechanical strength of the semiconductor wafer in which the trenches are formed is further ensured. Therefore, it becomes extremely easier to handle the semiconductor wafer and feasible to securely prevent the deformation and damage of the semiconductor wafer.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 13 is a drawing for explaining the manufacturing process for edge illuminated type photodiodes according to the first embodiment.

DESCRIPTION OF THE PREFERRED EMBODIMENTS

The preferred embodiments of the present invention will be described below in detail with reference to the accompanying drawings. In the description, the same elements or elements with the same functionality will be denoted by the same reference signs, without redundant description.

First Embodiment

A manufacturing process for edge illuminated type photodiodes according to the first embodiment will be described with reference to FIGS. 1 to 13. FIGS. 1 to 13 are drawings for explaining the manufacturing process for edge illuminated type photodiodes according to the first embodiment.

Figure 1:
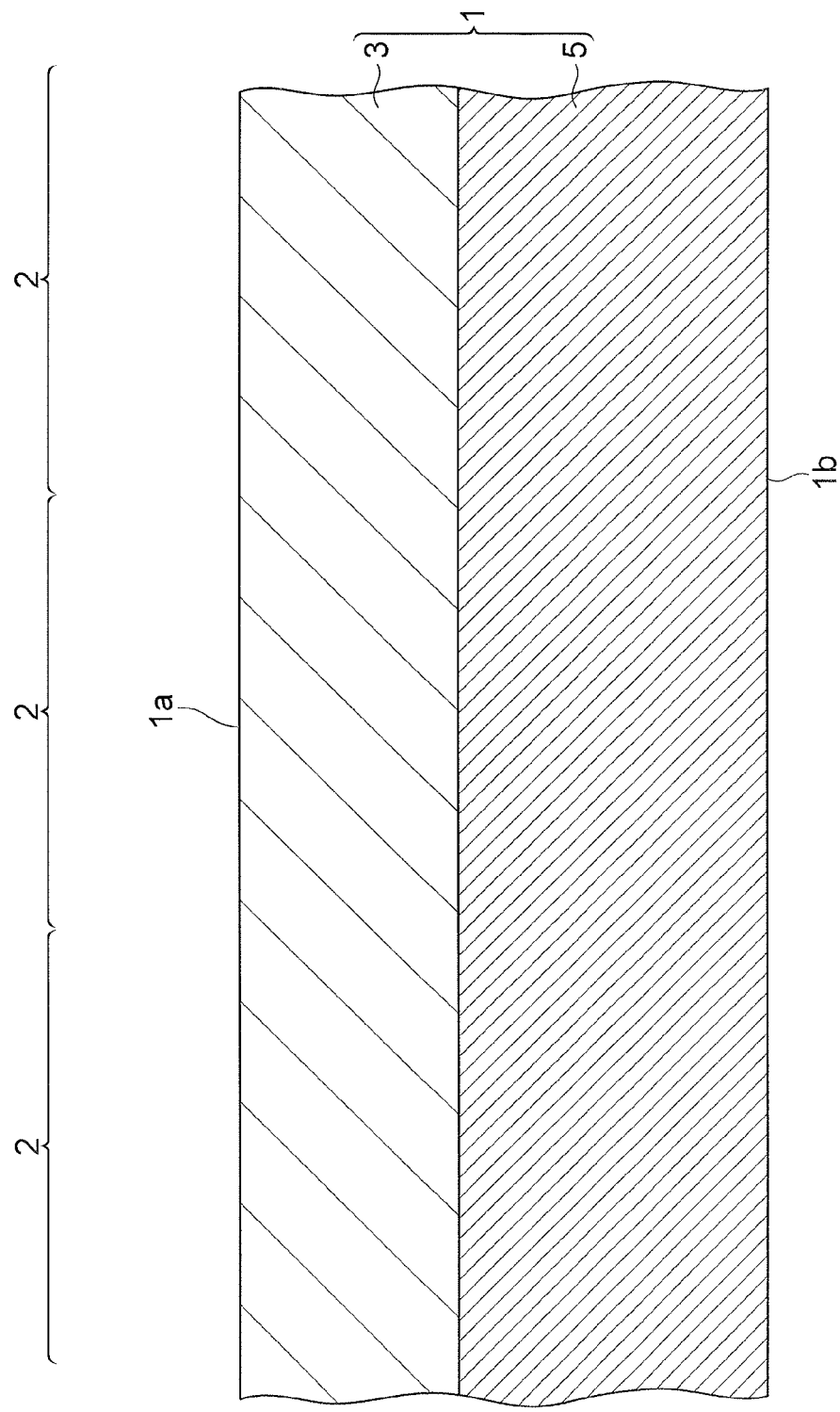
FIG. 1 is a drawing for explaining a manufacturing process for edge illuminated type photodiodes according to the first embodiment.
Figure 2:
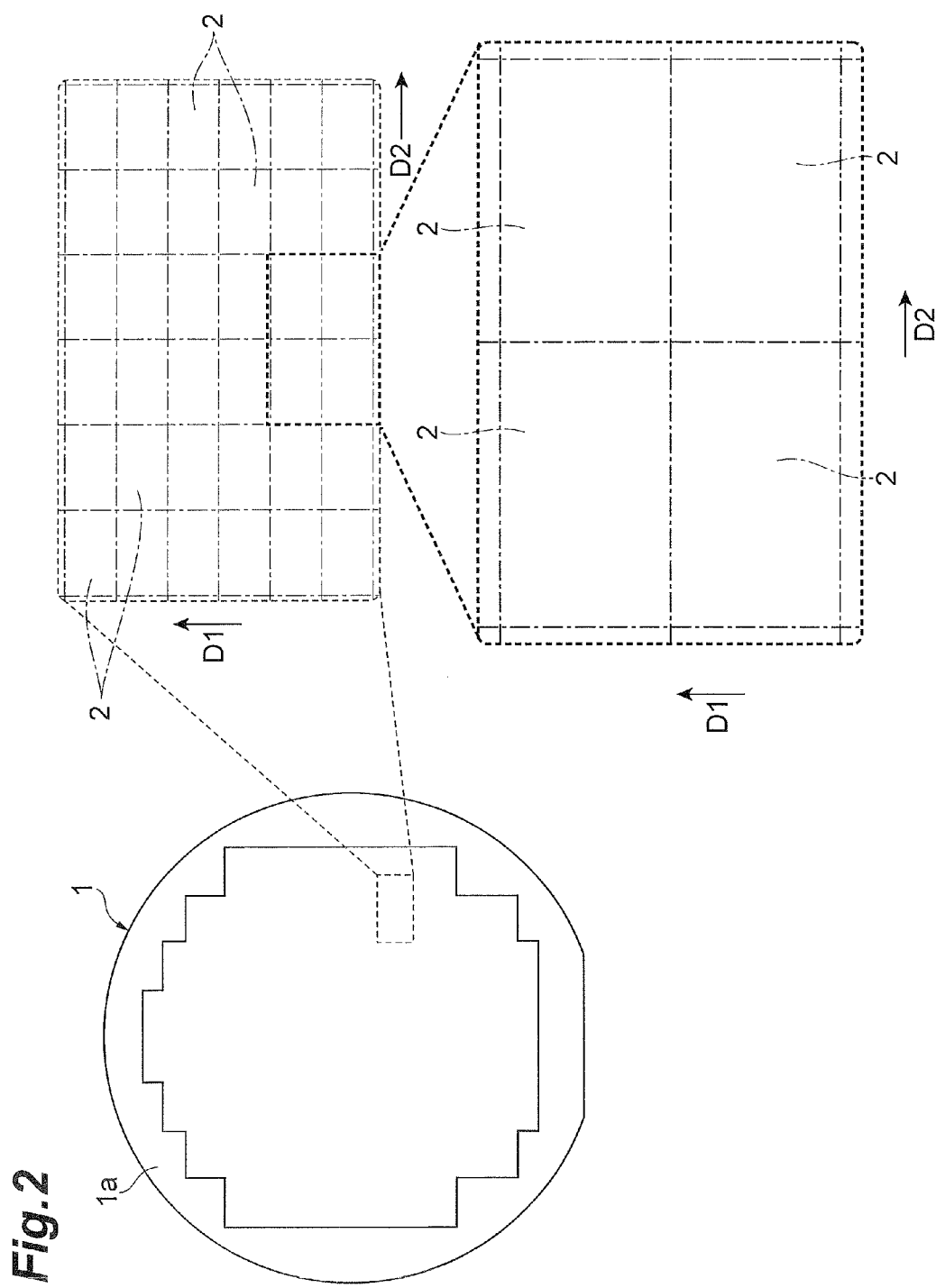
FIG. 2 is a drawing for explaining the manufacturing process for edge illuminated type photodiodes according to the first embodiment.

First, a semiconductor substrate 1 is prepared (cf. FIGS. 1 and 2). The semiconductor substrate 1 is a silicon substrate having a principal surface 1a and a principal surface 1b opposed to each other. The semiconductor substrate 1 includes a first substrate region 3 of the first conductivity type (e.g., n-type) located on the principal surface 1a side and a second substrate region 5 of the first conductivity type (e.g., n-type) located on the principal surface 1b side. The second substrate region 5 has a higher impurity concentration than the first substrate region 3.

The semiconductor substrate 1 can be obtained, for example, by growing on an $n^+$-type semiconductor substrate with a high impurity concentration, an n-type epitaxial layer with a lower impurity concentration than the semiconductor substrate. Namely, the semiconductor substrate 1 to be used herein can be a so-called epitaxial substrate. In this case, the $n^+$-type semiconductor substrate corresponds to the second substrate region 5 and the n-type epitaxial layer to the first substrate region 3. In the present embodiment, as shown in FIG. 2, a semiconductor wafer (epitaxial wafer) is used as the semiconductor substrate 1.

The semiconductor substrate 1, as shown in FIGS. 1 and 2, includes a plurality of device forming regions 2. The plurality of device forming regions 2 are located next to each other in a first direction D1 and in a second direction D2 intersecting with the first direction D1. In the present embodiment, the first direction D1 is perpendicular to the second direction D2. The device forming regions 2 are of a rectangular shape on a plan view. In FIG. 2, chain lines indicate positions of boundaries between adjacent device forming regions 2.

Figure 3:
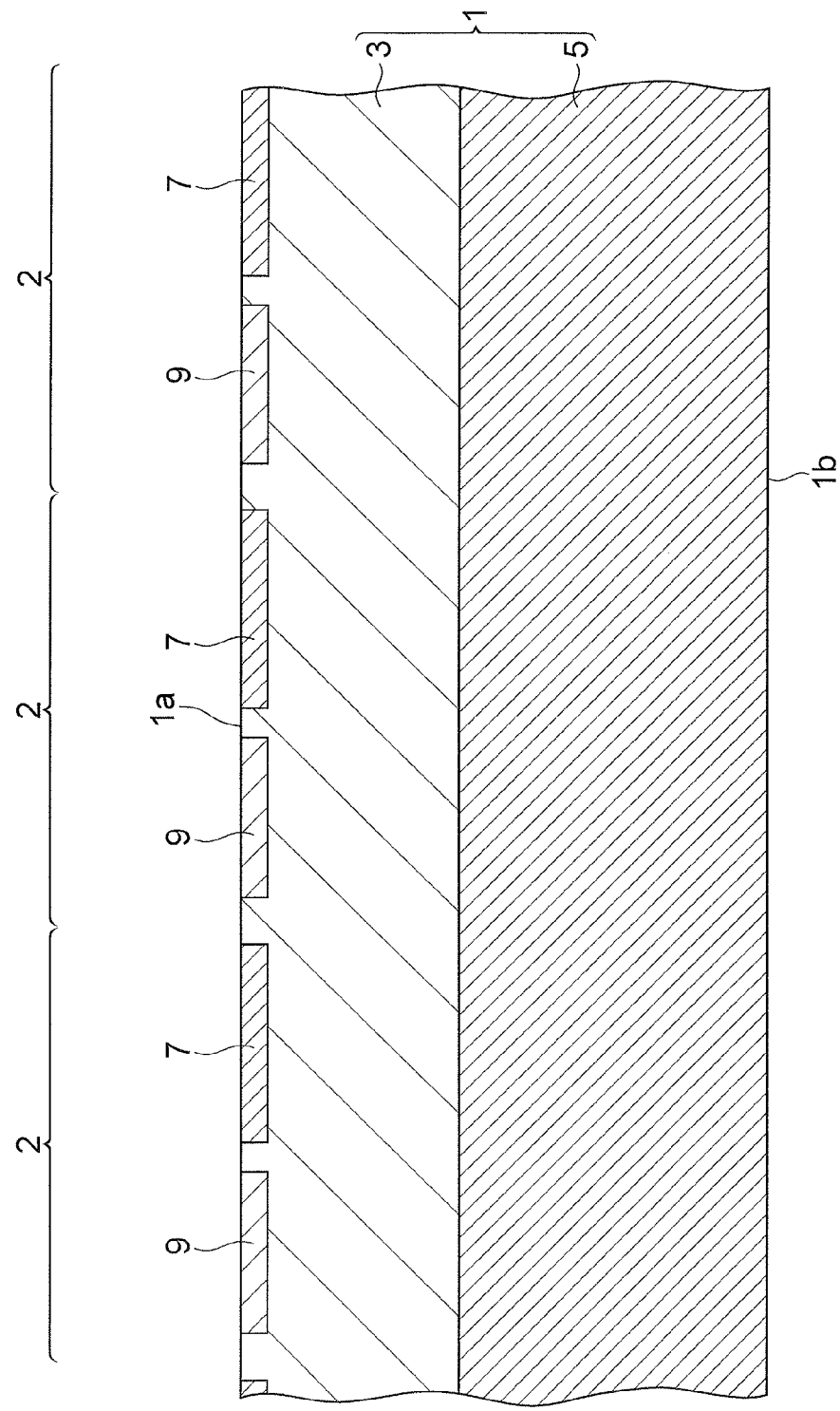
FIG. 3 is a drawing for explaining the manufacturing process for edge illuminated type photodiodes according to the first embodiment.

Next, a plurality of impurity-doped layers 7 of the first conductivity type and a plurality of impurity-doped layers 9 of the second conductivity type (e.g., p-type) are formed on the principal surface 1a side of the semiconductor substrate 1 (first substrate region 3) (cf. FIG. 3). The impurity-doped layers 7 are regions doped with an impurity of the first conductivity type (e.g., antimony, arsenic, or phosphorus) and have a higher impurity concentration than the first substrate region 3. The impurity-doped layers 9 are regions doped with an impurity of the second conductivity type (e.g., boron) and have a higher impurity concentration than the first substrate region 3. The impurities of the first and second conductivity types can be added in the first substrate region 3 by an ion implantation method or by a diffusion method.

The impurity-doped layers 7, 9 are formed in each of the plurality of device forming regions 2. When viewed from a direction perpendicular to the principal surface 1a, the impurity-doped layer 7 and the impurity-doped layer 9 are arranged as adjacent to each other in each device forming region 2. The impurity-doped layers 7 are formed, for example, by diffusing the n-type impurity to the high concentration from the principal surface 1a side in the first substrate region 3, using a mask or the like with openings at predetermined positions. The impurity-doped layers 9 are formed, for example, by diffusing the p-type impurity to the high concentration from the principal surface 1a side in the first substrate region 3, using another mask or the like with openings at predetermined positions.

Each impurity-doped layer 9 has a first portion 9a to be connected to a below-described electrode 17, a second portion 9b located next to one side extending along the second direction D2 of the device forming region 2 and extending along the one side, and a third portion 9c interconnecting the first portion 9a and the second portion 9b. The second portion 9b of the impurity-doped layer 9 is located apart from the one side extending in the second direction D2 of the device forming region 2 and is not exposed in a side face 2a of the device forming region 2 after a below-described trench 11 is formed. The impurity-doped layer 7 is configured in a layout such that a portion thereof becomes closer to the second portion 9b of the impurity-doped layer 9, i.e., to the side extending in the second direction D2 of the device forming region 2 (the side face 2a of the device forming region 2).

Figure 4:
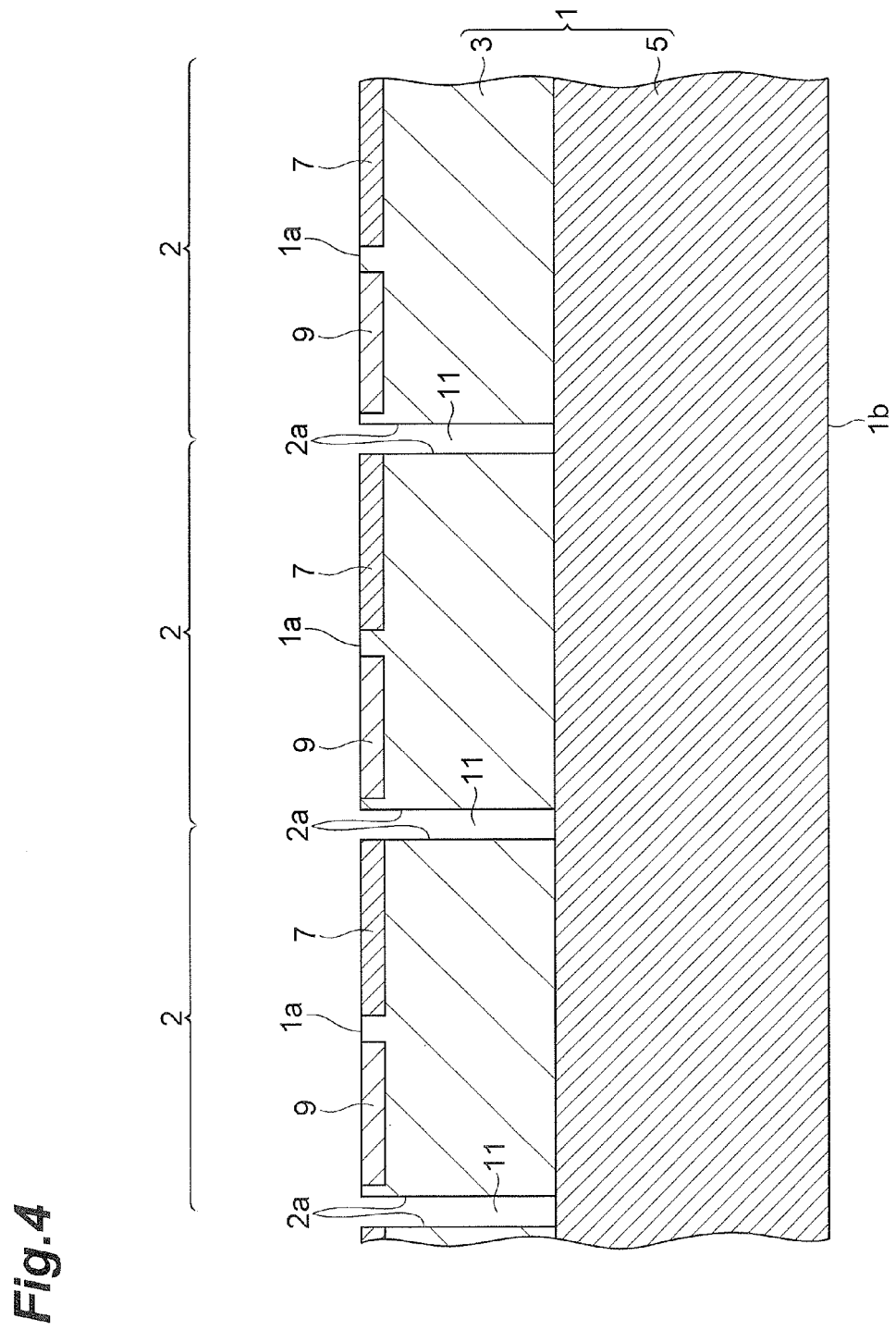
FIG. 4 is a drawing for explaining the manufacturing process for edge illuminated type photodiodes according to the first embodiment.
Figure 5:
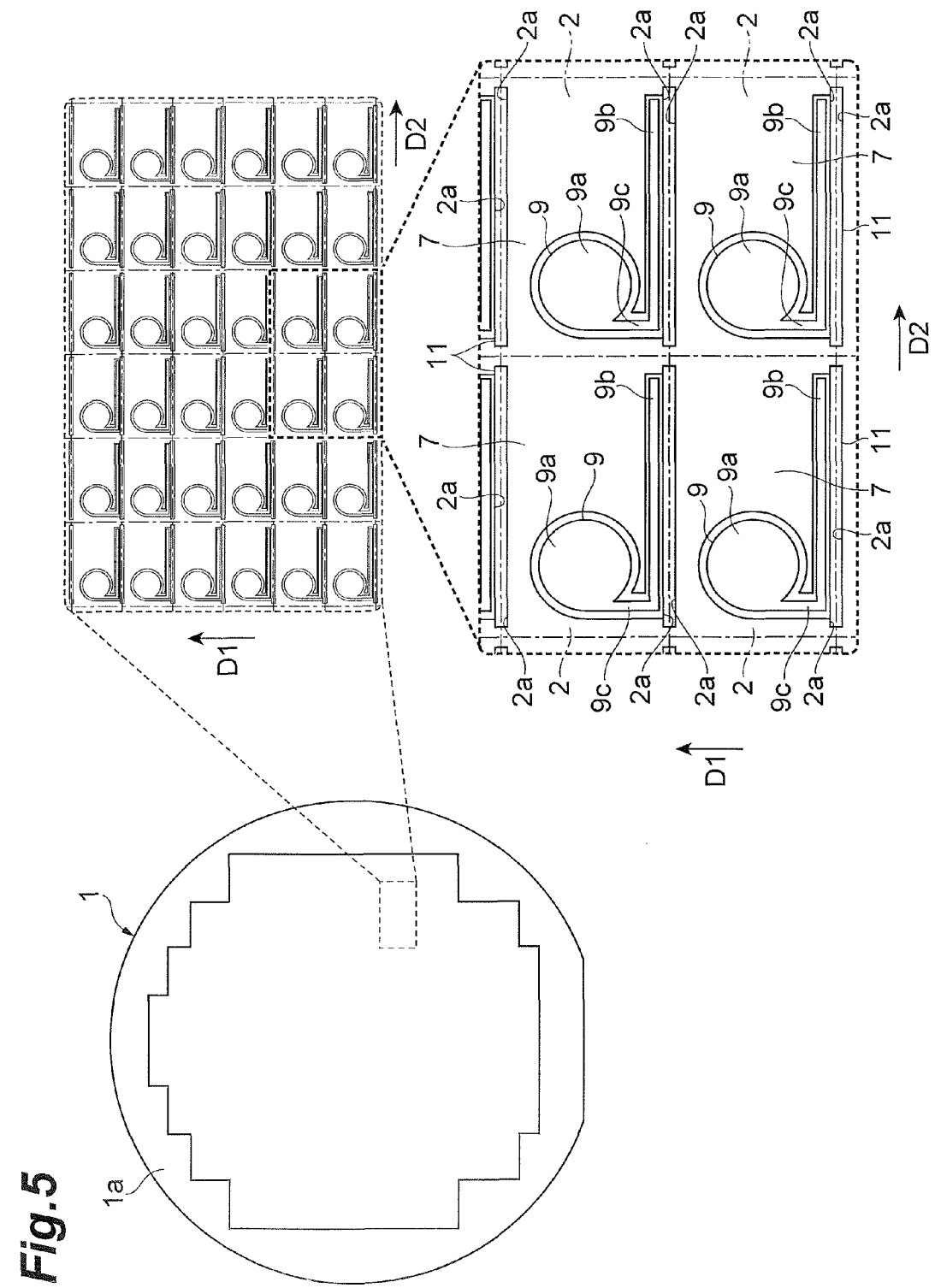
FIG. 5 is a drawing for explaining the manufacturing process for edge illuminated type photodiodes according to the first embodiment.

Next, trenches 11 are formed from the principal surface 1a, at positions of boundaries between adjacent device forming regions 2 out of the plurality of device forming regions 2 in the semiconductor substrate 1 (semiconductor wafer) (cf. FIGS. 4 and 5). The trenches 11 are formed by etching so as to extend in the direction of thickness of the semiconductor substrate 1. Namely, the direction of depth of the trenches 11 is the direction of thickness of the semiconductor substrate 1. The depth of the trenches 11 is set to a value smaller than the thickness of the semiconductor substrate 1. Namely, in the present embodiment, the trenches 11 are formed so as not to penetrate through the semiconductor substrate 1 and the depth thereof is the same value as the thickness of the first substrate region 3. The etching to be employed herein can be dry etching (e.g., Reactive Ion Etching (RIE) or plasma etching) and, particularly, deep dry etching.

The trenches 11, as shown in FIG. 5, are formed so as to extend in the direction perpendicular to the first direction D1, at the positions of the boundaries between device forming regions 2 adjacent to each other in the first direction D1 out of the plurality of device forming regions 2. The trenches 11 are not formed at positions of boundaries between device forming regions adjacent to each other in the second direction D2 out of the device forming regions 2. Therefore, the adjacent device forming regions 2 are continuous to each other in the second direction D2.

The trenches 11 are formed for the respective corresponding device forming regions 2 so as to be physically separated from each other. Namely, the trenches 11 are intermittently formed in the direction perpendicular to the first direction D1. In the present embodiment, the trenches 11 are formed after the impurity-doped layers 7 and 9 are formed in the device forming regions 2.

As the trenches 11 are formed at the foregoing positions, side faces 2a of each device forming region 2 are formed and the side faces 2a are exposed. Since the side faces 2a are formed by etching, the surface thereof is extremely smoother than the surface formed by dicing.

Figure 6:
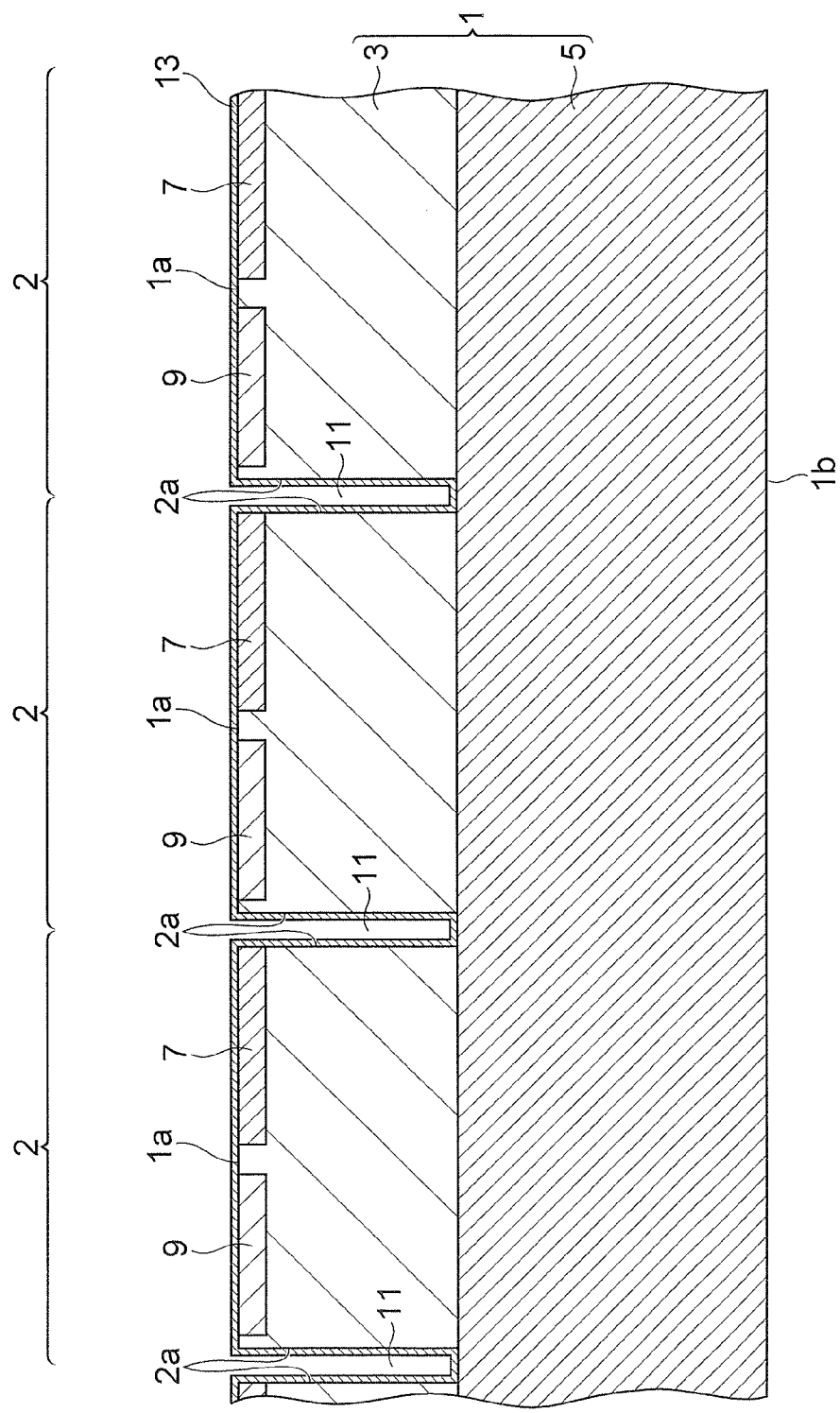
FIG. 6 is a drawing for explaining the manufacturing process for edge illuminated type photodiodes according to the first embodiment.

Next, an insulating film 13 is formed on the semiconductor substrate 1 (semiconductor wafer) (cf. FIG. 6). The insulating film 13 is formed so as to cover the principal surface 1a of the semiconductor substrate 1 and inside faces defining the trenches 11, on the principal surface 1a side of the semiconductor substrate 1. Through this process, the insulating film 13 is formed on the exposed side faces 2a of the device forming regions 2 whereby the side faces 2a are covered by the insulating film 13. The insulating film 13 is comprised of SiN and functions as an antireflection film. The insulating film 13 is formed, for example, by plasma CVD (Plasma-enhanced Chemical Vapor Deposition).

Figure 7:
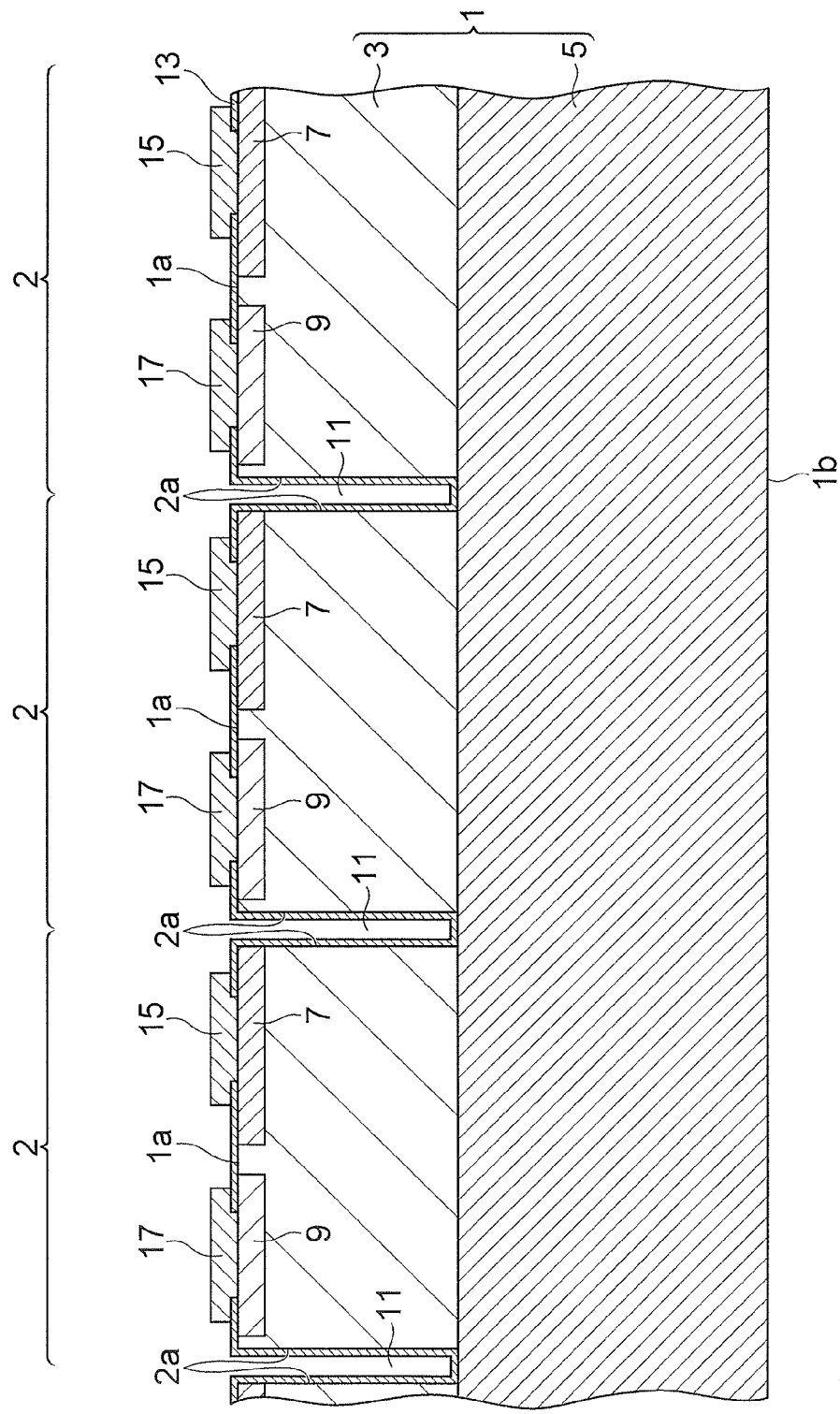
FIG. 7 is a drawing for explaining the manufacturing process for edge illuminated type photodiodes according to the first embodiment.

Next, electrodes 15 and 17 are formed on the principal surface 1a side of the semiconductor substrate 1 (semiconductor wafer) (cf. FIG. 7). The electrodes 15, 17 are formed for the respective corresponding impurity-doped layers 7, 9, after removal of portions of the insulating film 13 formed on the impurity-doped layers 7, 9. This process results in connecting the electrodes 15 to the corresponding impurity-doped layers 7 and the electrodes 17 to the corresponding impurity-doped layers 9. The electrodes 15, 17 are comprised, for example, of an electrode material such as aluminum.

Figure 8:
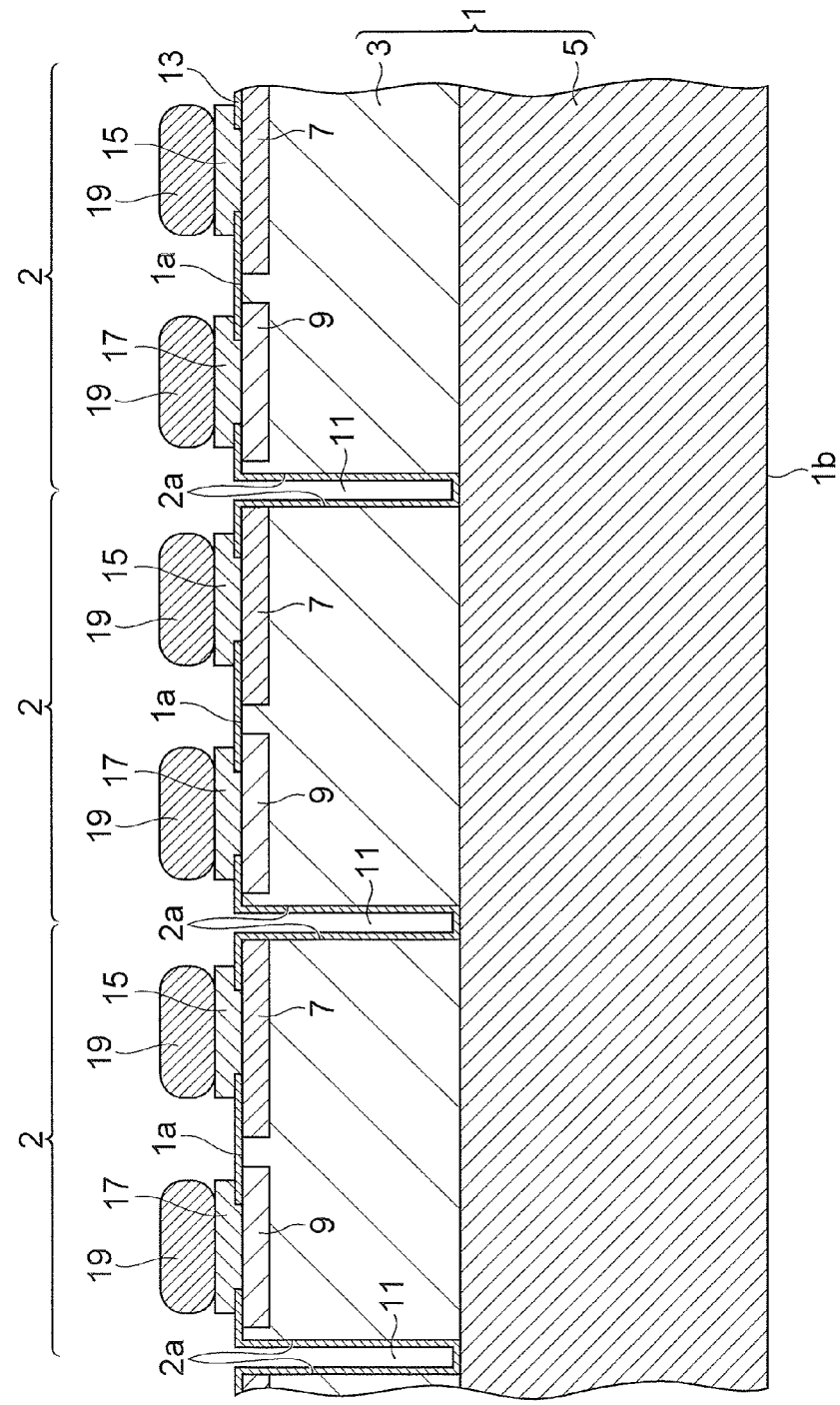
FIG. 8 is a drawing for explaining the manufacturing process for edge illuminated type photodiodes according to the first embodiment.

Next, solder bumps 19 are formed on the respective electrodes 15, 17 (cf. FIG. 8). The solder bumps 19 are comprised, for example, of a gold-tin alloy (Au—Sn) and formed by a lift-off process.

Figure 9:
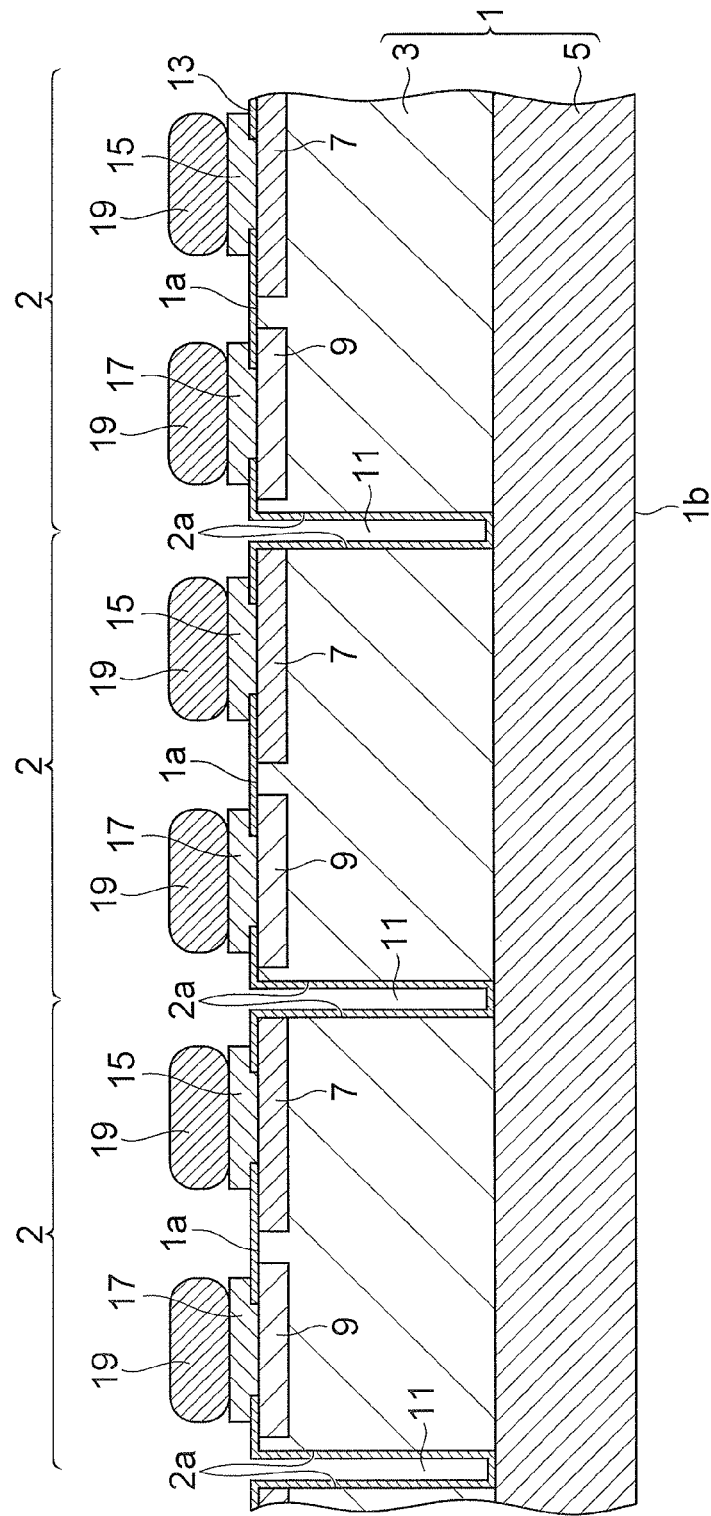
FIG. 9 is a drawing for explaining the manufacturing process for edge illuminated type photodiodes according to the first embodiment.

Next, the semiconductor substrate 1 (semiconductor wafer) is thinned from the principal surface 1b side (cf. FIG. 9). In the present embodiment, the second substrate region 5 of the semiconductor substrate 1 is thinned. The thinning of the second substrate region 5 (semiconductor substrate 1) is carried out, for example, by dry etching or by mechanical polishing. The mechanical polishing embraces cutting, grinding, dry polishing, and so on.

Figure 10:
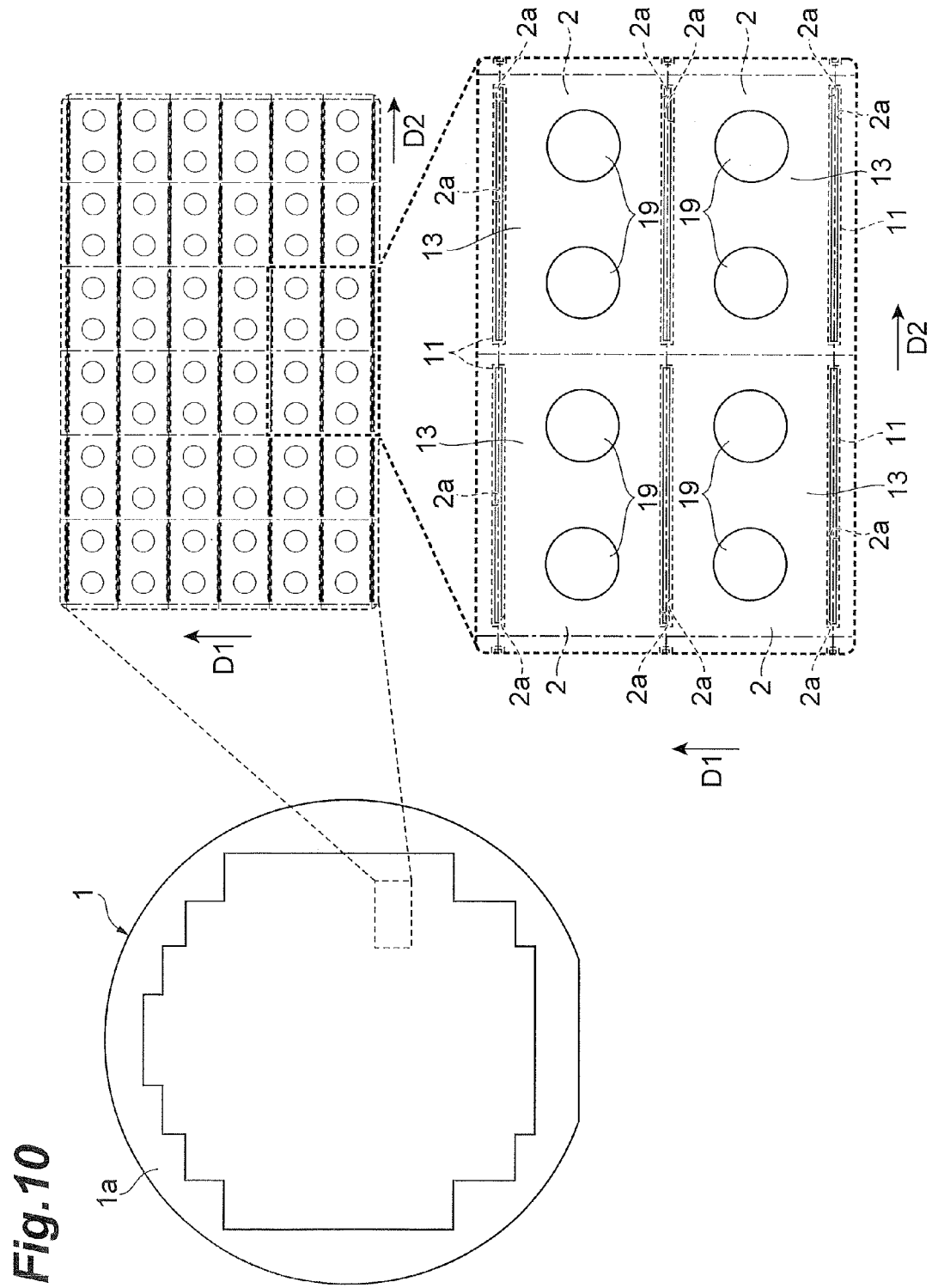
FIG. 10 is a drawing for explaining the manufacturing process for edge illuminated type photodiodes according to the first embodiment.

The semiconductor substrate 1 (semiconductor wafer) obtained through the above process is provided with the impurity-doped layers 7, 9 formed in the respective device forming regions 2, and the electrodes 15, 17 formed corresponding to the respective impurity-doped layers 7, 9 on the principal surface 1a side of the semiconductor substrate 1, as shown in FIGS. 9 and 10. In the semiconductor substrate 1, the trenches 11 extending in the thickness direction of the semiconductor substrate 1 from the principal surface 1a are formed by etching at the positions of the boundaries between adjacent device forming regions 2 so as to expose the side faces 2a of each device forming region 2. The insulating film 13 is formed on the exposed side faces 2a of the device forming regions 2.

Figure 11:
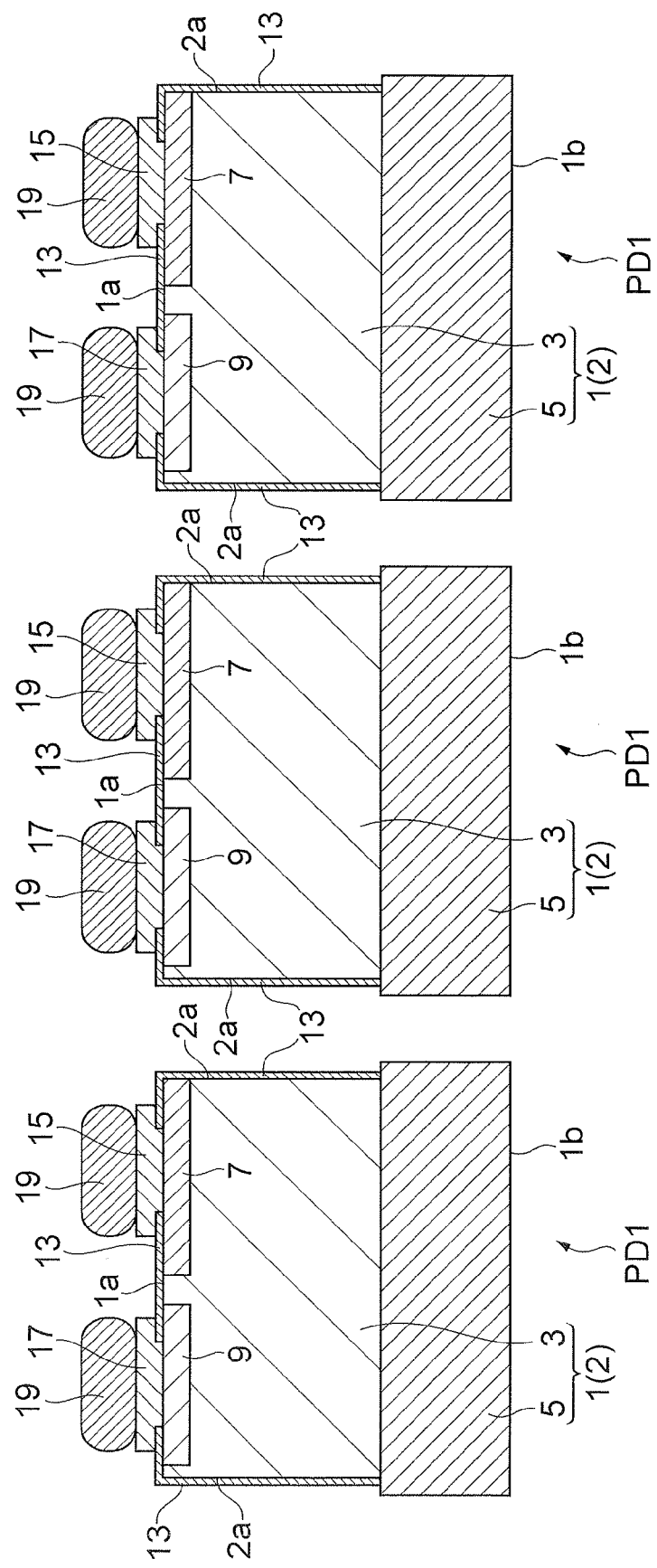
FIG. 11 is a drawing for explaining the manufacturing process for edge illuminated type photodiodes according to the first embodiment.

Next, the semiconductor substrate 1 (semiconductor wafer) is singulated into the individual device forming regions 2 (cf. FIG. 11). This process results in obtaining the edge illuminated type photodiodes PD1.

In the present embodiment, the singulation of the semiconductor substrate 1 is carried out by the stealth dicing technology. The stealth dicing technology is a dicing technique of applying a laser light to an internal portion of a semiconductor substrate (semiconductor wafer) to form modified regions at arbitrary positions and cutting the semiconductor substrate with the modified regions serving as starting points (e.g., reference should be made to U.S. Pat. Published Application No. 2010/0301521). A laser process device used in the stealth dicing technology is so called SDE (stealth dicing engine: registered trademark). This SDE is provided, for example, with a laser source for pulsatingly oscillating a laser light, a dichroic mirror arranged to change the direction of the optical axis (optical path) of the laser light, and a condensing lens (condensing optical system) for converging the laser light.

Figure 12:
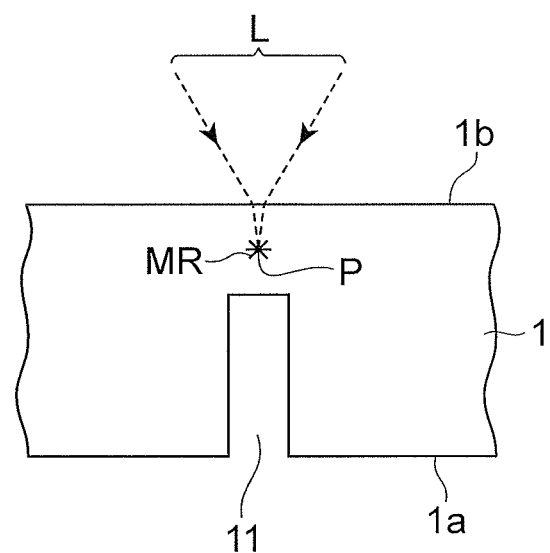
FIG. 12 is a drawing for explaining the manufacturing process for edge illuminated type photodiodes according to the first embodiment.

In this process, the laser light L is applied from the principal surface 1b side and, with a light-converging point P at an internal portion of the semiconductor substrate 1 (cf. FIG. 12), the laser light L is moved relative to the substrate along an intended cutting line (a line along a chain line in FIG. 2) at a position of a boundary between adjacent device forming regions 2 out of the plurality of device forming regions 2. This operation results in forming modified regions MR, which will serve as starting points of cutting, in the internal portion of the semiconductor substrate 1 along the intended cutting line (cf. (a) and (b) of FIG. 13). Then the semiconductor substrate 1 is cut with the formed modified regions MR serving as starting points, to implement the singulation. In FIGS. 12 and 13, the semiconductor substrate 1 is schematically illustrated without illustration of the insulating film 13, the electrodes 15, 17, and the solder bumps 19.

The light-converging point P is a position where the laser light L is converged. The modified regions MR are continuously formed in certain cases or intermittently formed in some cases. The modified regions MR may be formed in a line pattern or in a dot pattern and it is sufficient to form the modified regions MR at least in the internal portion of the semiconductor substrate 1. Fractures can be formed from starting points of the modified regions MR in certain cases and the fractures and modified regions MR may be exposed in the exterior surface of the semiconductor substrate 1 (the front surface, the back surface, or the circumferential surface).

The laser light L transmits through the semiconductor substrate 1 and is absorbed, particularly, near the light-converging point in the internal portion of the semiconductor substrate 1, whereby the modified regions MR are formed in the semiconductor substrate 1 (that is, an internal absorption type laser processing). Therefore, the laser light L is scarcely absorbed at the principal surface 1b of the semiconductor substrate 1 and thus the principal surface 1b of the semiconductor substrate 1 is not melted thereby.

The modified regions formed in the present embodiment are regions different in density, refractive index, mechanical strength, and other physical properties from surroundings. Examples of the modified regions include melting processed regions, crack regions, dielectric breakdown regions, refractive-index changed regions, and so on, and also include mixed regions of these. The modified regions include regions where the density of the modified regions is changed in comparison to the density of non-modified regions in the semiconductor substrate 1, and regions where lattice defects are formed (which are also referred to together as high-density transitional regions).

The edge illuminated type photodiode PD1, as shown in FIGS. 11 and 14-16, is provided with the semiconductor substrate 1 (first and second substrate regions 3, 5), the first and second conductivity type impurity-doped layers 7, 9, the insulating film 13, the electrodes 15, 17, and the solder bumps 19. The semiconductor substrate 1 in the photodiode PD1 is a substrate portion corresponding to the device forming region 2. The photodiode PD1 can be used as a photodiode for monitoring light emitted from a semiconductor laser device.

Figure 14:
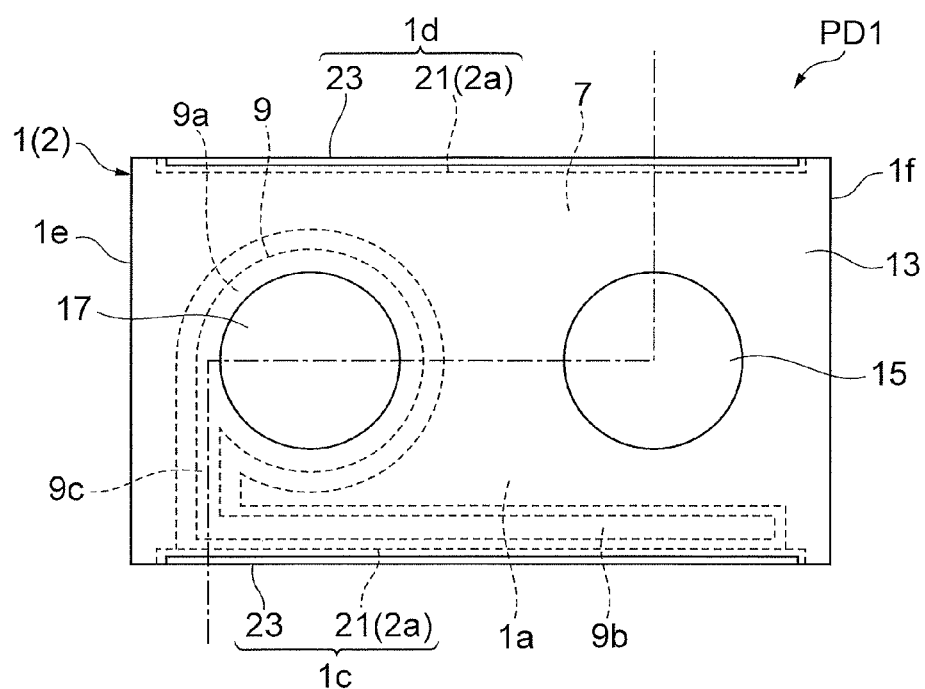
FIG. 14 is a plan view showing an edge illuminated type photodiode according to the first embodiment.
Figure 15:
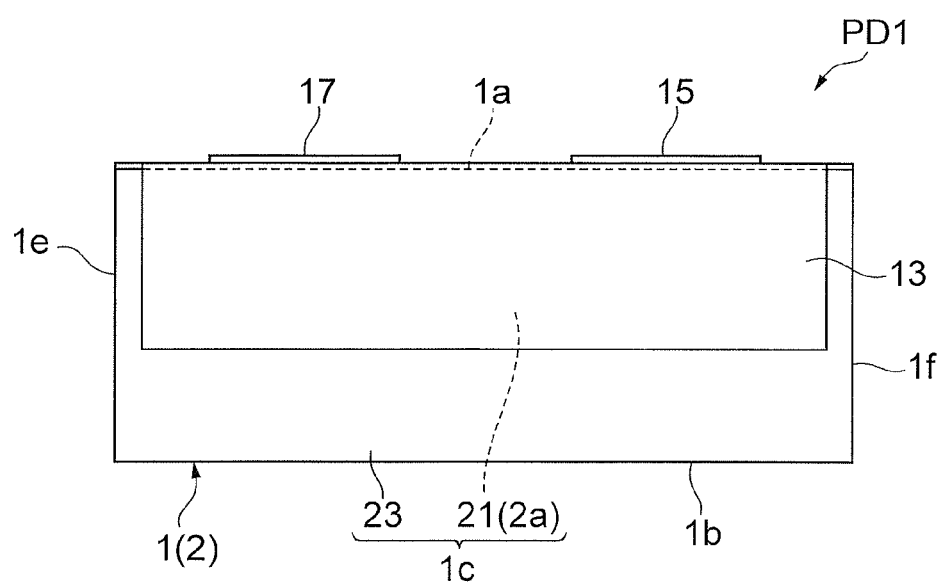
FIG. 15 is a side view showing the edge illuminated type photodiode according to the first embodiment.
Figure 16:
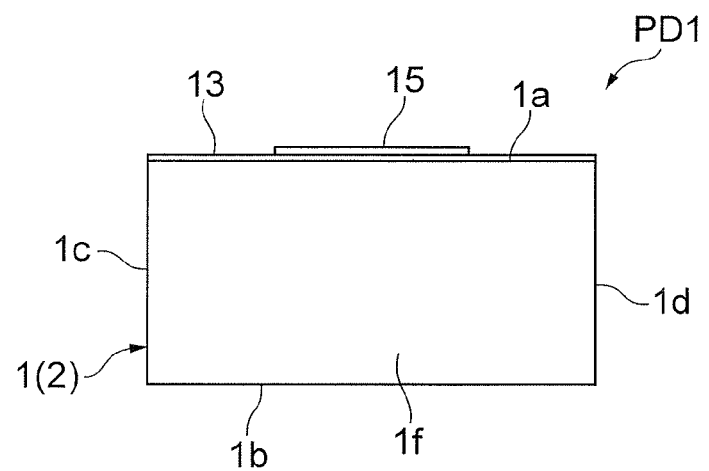
FIG. 16 is an end view showing the edge illuminated type photodiode according to the first embodiment.

FIG. 14 is a plan view showing the edge illuminated type photodiode according to the first embodiment. FIG. 15 is a side view showing the edge illuminated type photodiode according to the first embodiment. FIG. 16 is an end view showing the edge illuminated type photodiode according to the first embodiment. The sectional configuration of each photodiode PD1 shown in FIG. 11 corresponds to a sectional configuration in a cross section resulting from cutting of the photodiode PD1 along a double-dashed chain line shown in FIG. 14. Namely, the sectional configurations shown in FIGS. 3, 4, and 6-9 also correspond to that in the cross section resulting from cutting of the photodiode PD1 along the double-dashed chain line shown in FIG. 14. FIGS. 14 to 16 are depicted without illustration of the solder bumps 19.

The semiconductor substrate 1 has a pair of side faces 1c, 1d and a pair of end faces 1e, 1f, in addition to a pair of principal faces 1a, 1b, in the photodiode PD1. The photodiode PD1 has a planar shape of a rectangular shape. The photodiode PD1 is set, for example, in the planar shape of 1 or less mm×1 or less mm. The photodiode PD1 (excluding the solder bumps 19) is set, for example, in the thickness of 0.1 to 0.15 mm.

The side faces 1c, 1d are formed by the formation of the trenches 11 and the cutting by the stealth dicing technology in the foregoing manufacturing process. Therefore, the side faces 1c, 1d include regions 21 formed of the trenches 11

(regions corresponding to the side faces 2a of the device forming regions 2), and regions 23 formed by the cutting by the stealth dicing technology.

In the side faces 1c, 1d, the regions 21 formed of the trenches 11 are more depressed than the regions 23 formed by the cutting by the stealth dicing technology. Namely, the regions 21 and 23 make a step.

The insulating film 13 is formed on the regions 21 of the side faces 1c, 1d and the regions 21 are covered by the insulating film 13. The insulating film 13 is not formed on the regions 23 of the side faces 1c, 1d, where the semiconductor substrate 1 is exposed. The width of the regions 21, i.e., the width of the insulating film 13 (the length in the thickness direction of the photodiode PD1) is set, for example, in the range of 0.06 to 0.12 mm.

The end faces 1e, 1f are formed by the cutting by the stealth dicing technology in the foregoing manufacturing process. Therefore, the insulating film 13 is not formed on the end faces 1e, 1f, where the semiconductor substrate 1 is exposed.

In the photodiode PD1, a pn junction is formed between the first substrate region 3 and the impurity-doped layer 9. The impurity-doped layer 7 functions as a cathode and the electrode 15 as a cathode electrode. The impurity-doped layer 9 functions as an anode and the electrode 17 as an anode electrode. The region 21 of the side face 1c is defined as a surface where light is incident into the semiconductor substrate 1 (light incident surface).

In the edge illuminated type photodiode PD1, the region 21 of the side face 1c or 1d is formed by dry etching as described above. For this reason, the surface of the region 21 of the side face 1c is extremely smoother with less lattice defects than the surface formed by dicing. The region 21 of the side face 1c has the smoother surface than the region 23.

When the light in the relatively short wavelength region is incident through the region 21 of the side face 1c in the photodiode PD1, the incident light is absorbed in the region near the region 21 of the side face 1c to generate carriers. Since the region 21 of the side face 1c as the light incident surface is smoother with less lattice defects, the carriers are less likely to be trapped in the region 21 of the side face 1c (and the region near the region 21 of the side face 1c), which suppresses recombination of the generated carriers. Therefore, the generated carriers are prevented from becoming extinct, and thus make efficient contribution to output of the photodiode PD1. As a result, the photodiode PD1 can successfully detect the light in the relatively short wavelength region.

In the photodiode PD1, since the insulating film 13 covers the region 21 of the side face 1c (the region corresponding to the side face 2a of the device forming region 2), i.e., the light incident surface, this light incident surface is protected by the insulating film 13. Therefore, the recombination of generated carriers is surely suppressed in the photodiode PD1.

In the present embodiment, the insulating film 13 functions as an antireflection film. Since reflection is reduced by the insulating film as the antireflection film, the majority of the light incident through the region 21 of the side face 1c into the photodiode PD1 reaches the interior of the photodiode PD1, without being reflected by the region 21 (light incident surface) of the side face 1c. This improves the photosensitivity of the photodiode PD1.

The impurity-doped layer 9 has the second portion 9b located next to the region 21 of the side face 1c being the light incident surface (light receiving surface) and extending along the region 21, as described above. The second portion 9b of the impurity-doped layer 9 is located apart from the side face 1c and is not exposed in the side face 1c. The impurity-doped layer 7 has the portion located partly in proximity to the second portion 9b of the impurity-doped layer 9. The impurity-doped layer 7 reaches the side faces 1c, 1d and the end faces 1e, 1f and thus is exposed in the side faces 1c, 1d and the end faces 1e, 1f.

In the present embodiment, the impurity-doped layer 9 has the second portion 9b located in proximity to the region 21 of the side face 1c and the impurity-doped layer 7 has the portion located in proximity to the second portion 9b of the impurity-doped layer 9. For this reason, the distance from the impurity-doped layer 7 to the edge of the pn junction is short and a time necessary for carriers generated with incidence of light to reach the electrodes 15, 17 is short. This allows the photodiode PD1 to increase its response speed.

In the present embodiment, the semiconductor substrate 1 (semiconductor wafer) is cut by the stealth dicing technology to implement the singulation. For this reason, the modified regions formed along the intended cutting line constitute cutting start regions. Since the semiconductor substrate 1 is cut by application of the laser light L, the semiconductor substrate 1 can be cut in a shorter time than by the cutting method using the blade dicing. Since the semiconductor substrate 1 can be cut by dividing it along the cutting start regions by a relatively small force, generation of dust is kept at an extremely low level, requiring no cleaning process. Since the semiconductor substrate 1 can be cut by dividing it along the cutting start regions by a relatively small force, the cut face can be formed as a smoother surface than by the method using the blade dicing. As a consequence of these, the productivity of photodiode PD1 can be further improved.

In the present embodiment, the trenches 11 are formed so as to extend in the direction perpendicular to the first direction D1, at the positions of the boundaries between the device forming regions 2 adjacent to each other in the first direction D1 and are not formed at the positions of the boundaries between the device forming regions 2 adjacent to each other in the second direction D2. Since the device forming regions adjacent to each other in the second direction D2 are continuous to each other, the mechanical strength of the semiconductor substrate 1 (semiconductor wafer) is ensured even in a state in which the trenches 11 are formed at the positions of the boundaries between the device forming regions adjacent to each other in the first direction D1. Therefore, it becomes easier to handle the semiconductor substrate 1 and feasible to prevent deformation and damage of the semiconductor substrate 1.

In the present embodiment, the trenches 11 are formed for the respective corresponding device forming regions 2 so as to be physically separated from each other. This configuration further ensures the mechanical strength of the semiconductor substrate 1 (semiconductor wafer) in which the trenches 11 are formed. Therefore, it becomes extremely easier to handle the semiconductor substrate 1 and feasible to certainly prevent the deformation and damage of the semiconductor substrate 1.

Figure 17:
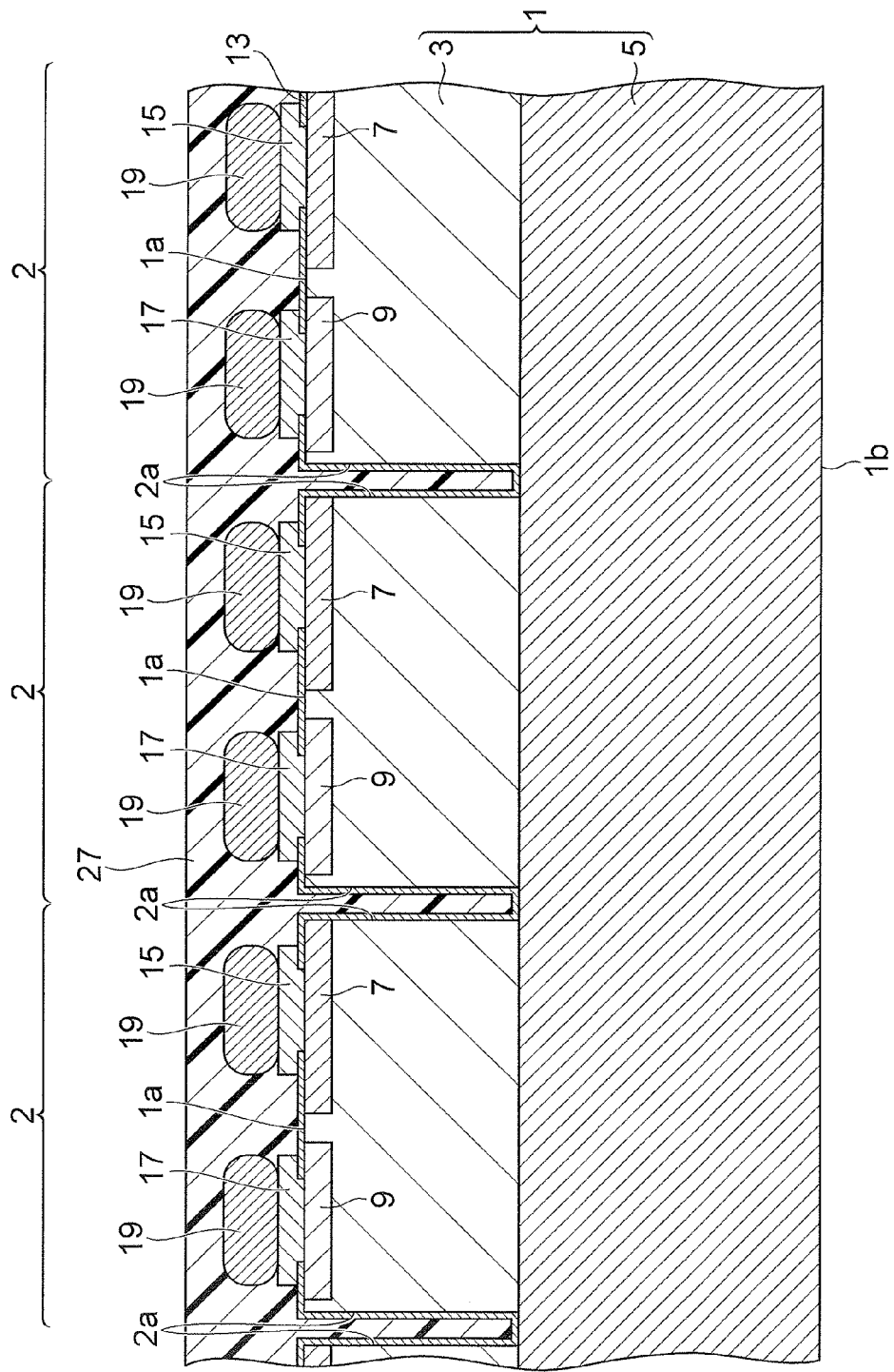
FIG. 17 is a drawing for explaining a manufacturing process for edge illuminated type photodiodes according to a modification example of the first embodiment.
Figure 18:
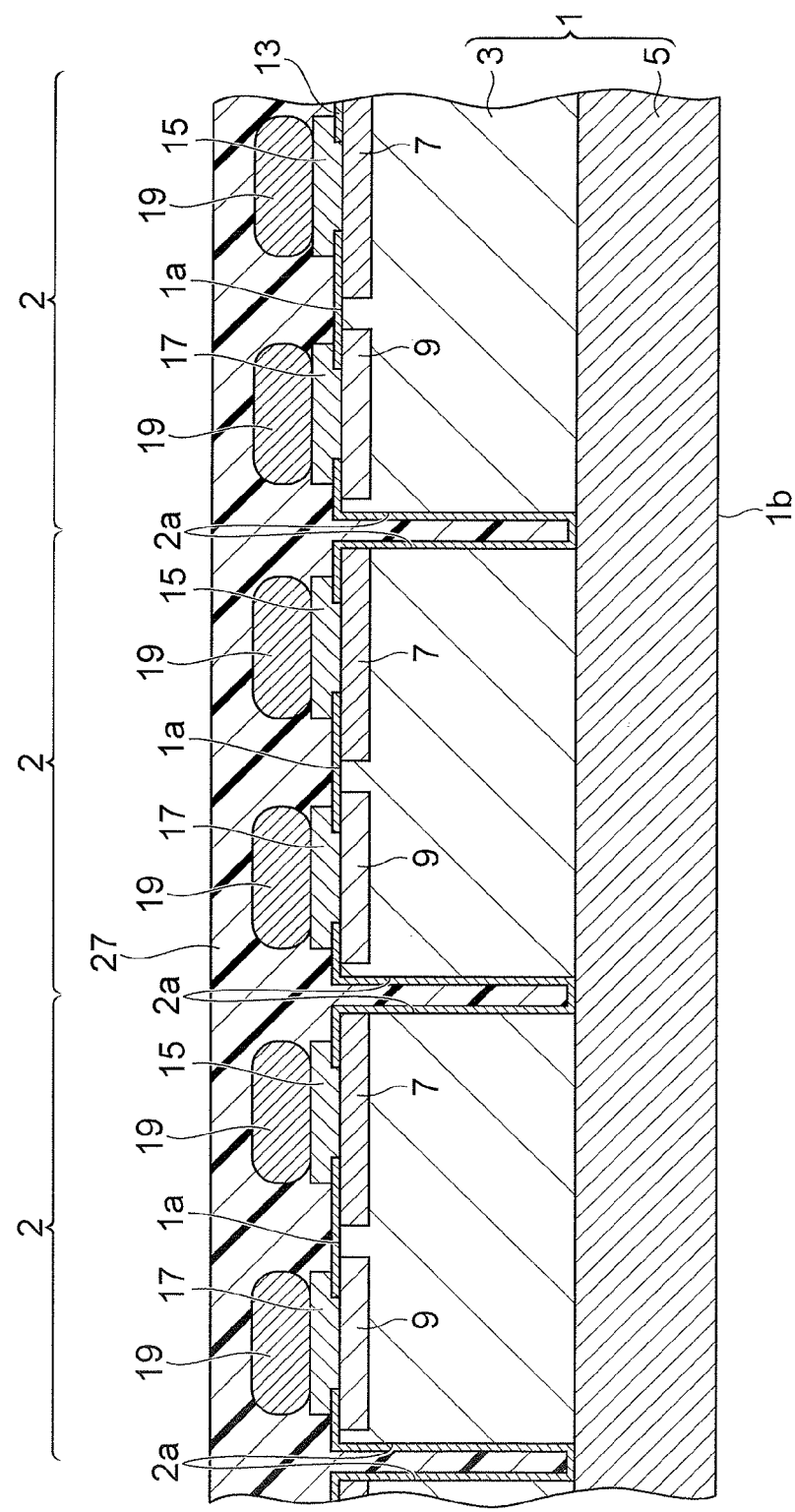
FIG. 18 is a drawing for explaining the manufacturing process for edge illuminated type photodiodes according to the modification example of the first embodiment.

The below will describe a modification example of the manufacturing method according to the first embodiment, with reference to FIGS. 17 and 18. FIGS. 17 and 18 are drawings for explaining the manufacturing process for edge illuminated type photodiodes according to the modification example of the first embodiment.

In the present modification example, a protective film 27 is formed on the semiconductor substrate 1 (cf. FIG. 17) before the semiconductor substrate 1 (semiconductor wafer) is thinned from the principal surface 1b side. The protective film 27 is formed so as to cover the principal surface 1a of the semiconductor substrate 1, the trenches 11, and the solder bumps 19 (electrodes 15, 17) on the principal surface 1a side of the semiconductor substrate 1. This further improves the mechanical strength of the semiconductor substrate 1. The protective film 27 is a film comprised of poly-para-xylylene. The protective film 27 is formed by CVD (Chemical Vapor Deposition).

Next, the semiconductor substrate 1 (semiconductor wafer) is thinned from the principal surface 1b side (cf. FIG. 18) and thereafter the protective film 27 is removed. Since the protective film 27 enhances the mechanical strength of the semiconductor substrate 1 as described above, the semiconductor substrate 1 is prevented from damaging, e.g., cracking, during the thinning process of the semiconductor substrate 1. The protective film 27 can be removed, for example, by plasma ashing. The thinned semiconductor substrate 1 (semiconductor wafer) is singulated as described above.

Second Embodiment

A manufacturing process for edge illuminated type photodiodes according to the second embodiment will be described with reference to FIGS. 19 to 29. FIGS. 19 to 29 are drawings for explaining the manufacturing process for edge illuminated type photodiodes according to the second embodiment.

Figure 19:
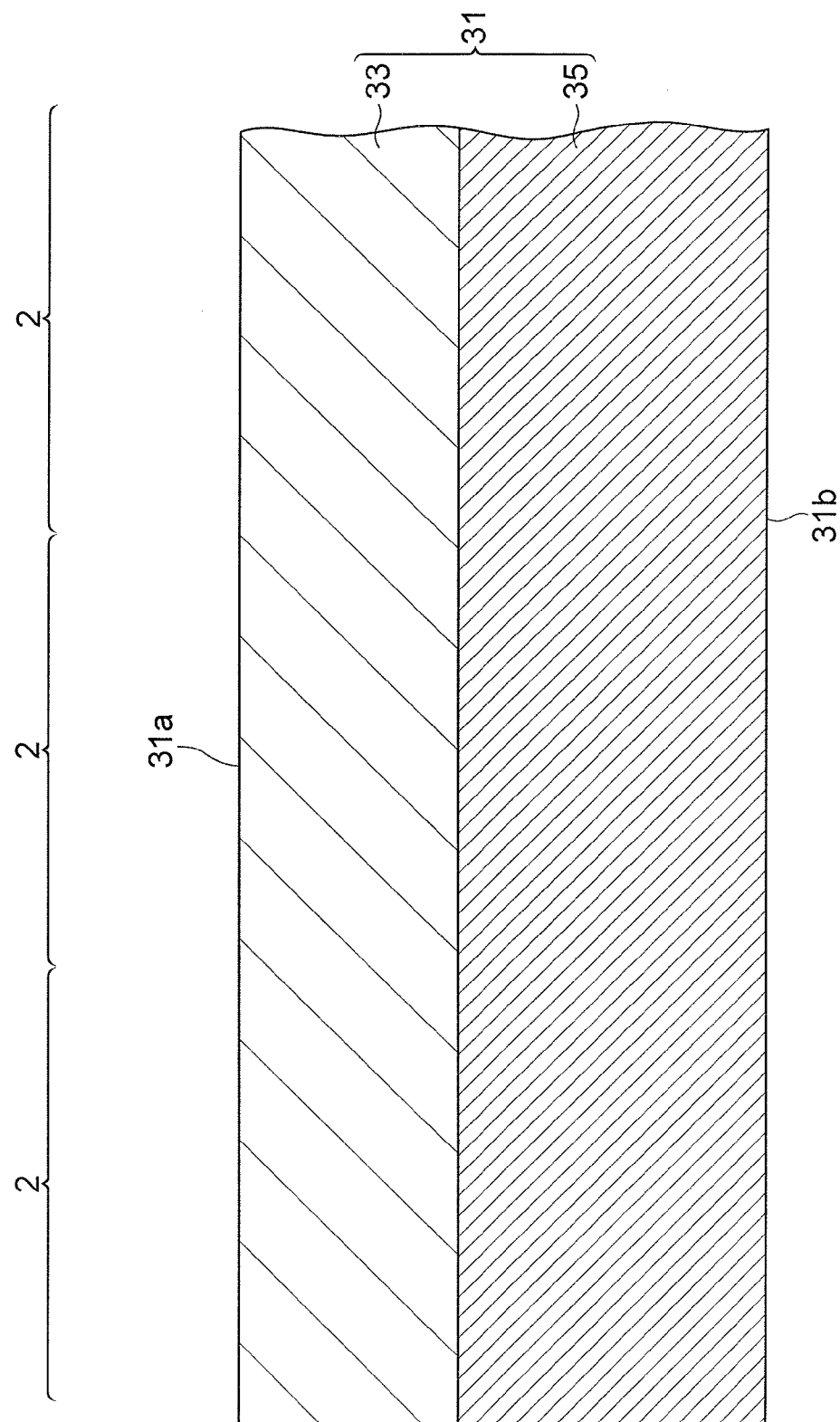
FIG. 19 is a drawing for explaining a manufacturing process for edge illuminated type photodiodes according to the second embodiment.
Figure 20:
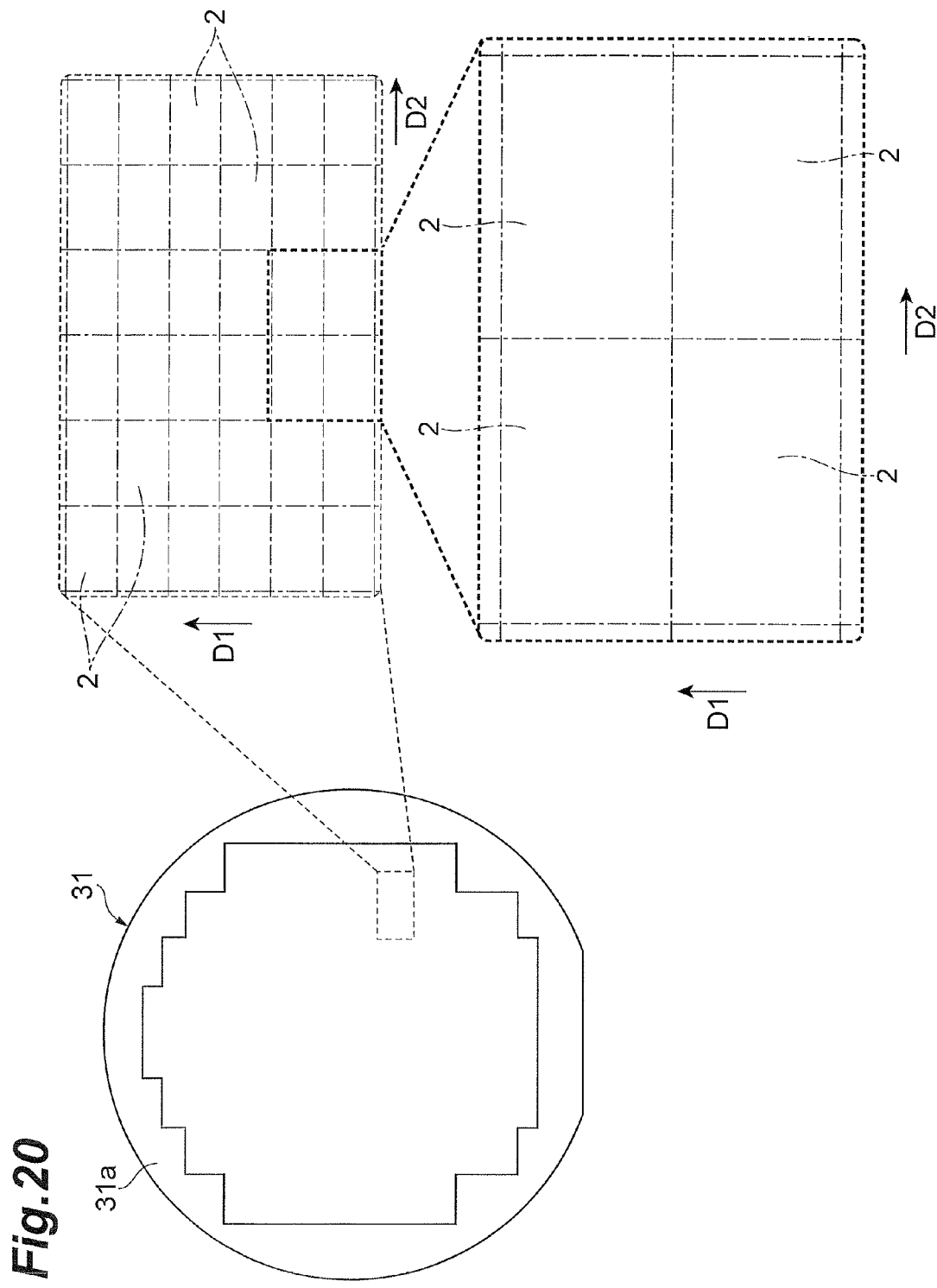
FIG. 20 is a drawing for explaining the manufacturing process for edge illuminated type photodiodes according to the second embodiment.

First, a semiconductor substrate 31 is prepared (cf. FIGS. 19 and 20). The semiconductor substrate 31 is a silicon substrate having a principal surface 31a and a principal surface 31b opposed to each other. The semiconductor substrate 31 includes a first substrate region 33 of the second conductivity type (e.g., p-type) located on the principal surface 31a side and a second substrate region 35 of the first conductivity type (e.g., n-type) located on the principal surface 31b side. The second substrate region 35 has a higher impurity concentration than the first substrate region 33.

The semiconductor substrate 31 can be obtained, for example, by growing on an $n^+$-type semiconductor substrate with a high impurity concentration, a p-type epitaxial layer with a lower impurity concentration than the semiconductor substrate. Namely, the semiconductor substrate 31 to be used herein can be a so-called epitaxial substrate. In this case, the $n^+$-type semiconductor substrate corresponds to the second substrate region 35 and the p-type epitaxial layer to the first substrate region 33. In the present embodiment, as shown in FIG. 20, a semiconductor wafer (epitaxial wafer) is also used as the semiconductor substrate 31.

The semiconductor substrate 31, as shown in FIGS. 19 and 20, includes a plurality of device forming regions 2. The plurality of device forming regions 2 are located next to each other in the first direction D1 and in the second direction D2 intersecting with the first direction D1. In FIG. 20 as well, chain lines indicate positions of boundaries between adjacent device forming regions 2.

Figure 21:
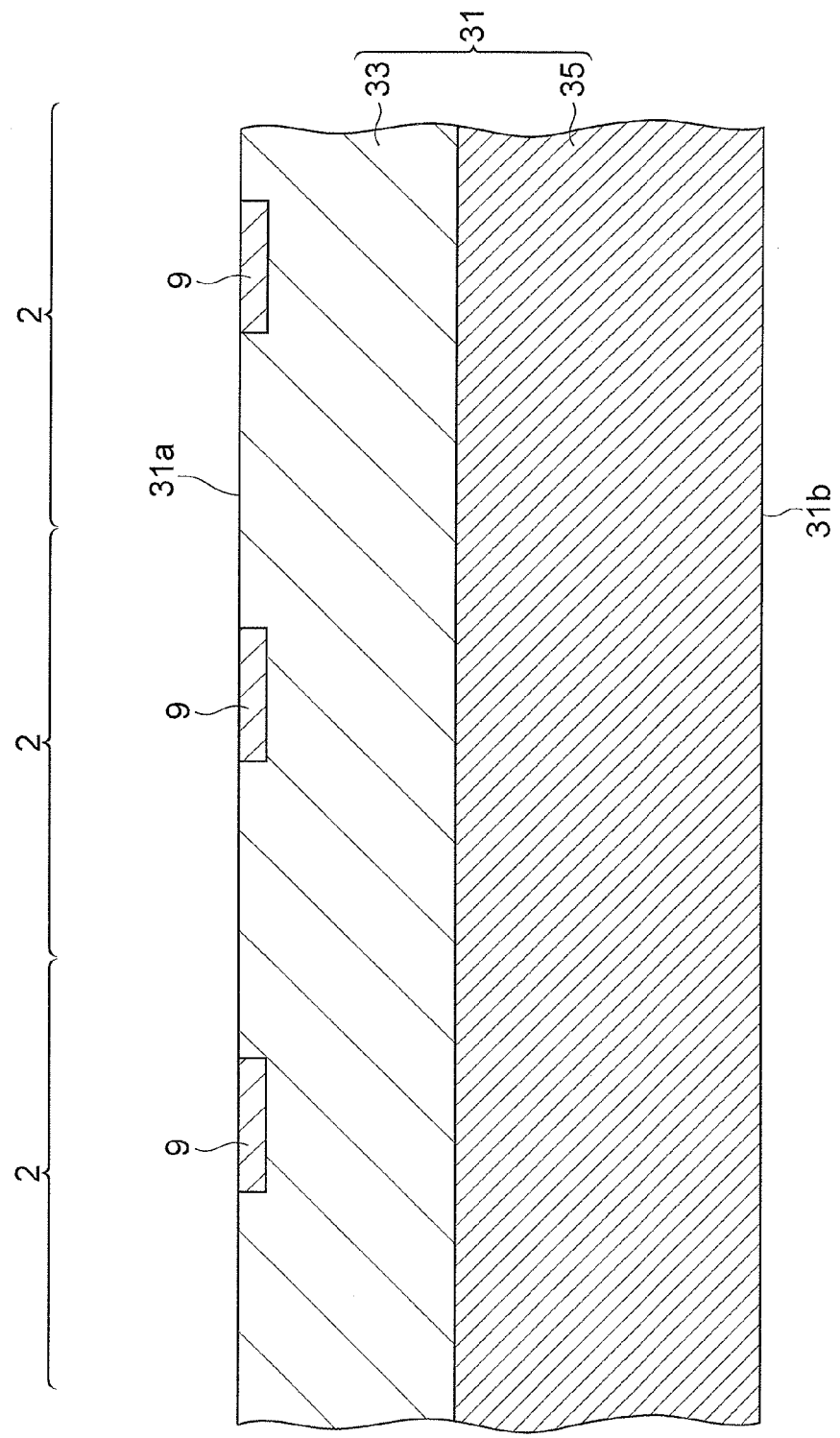
FIG. 21 is a drawing for explaining the manufacturing process for edge illuminated type photodiodes according to the second embodiment.

Next, a plurality of impurity-doped layers 9 of the second conductivity type (e.g., p-type) are formed on the principal surface 31a side of the semiconductor substrate 31 (first substrate region 33) (cf. FIG. 21). The impurity-doped layers 9 are regions doped with an impurity of the second conductivity type and have a higher impurity concentration than the first substrate region 33. The impurity of the second conductivity type can be added in the first substrate region 3 by the ion implantation method or by the diffusion method. The impurity-doped layers 9 are formed in the respective device forming regions 2.

Figure 22:
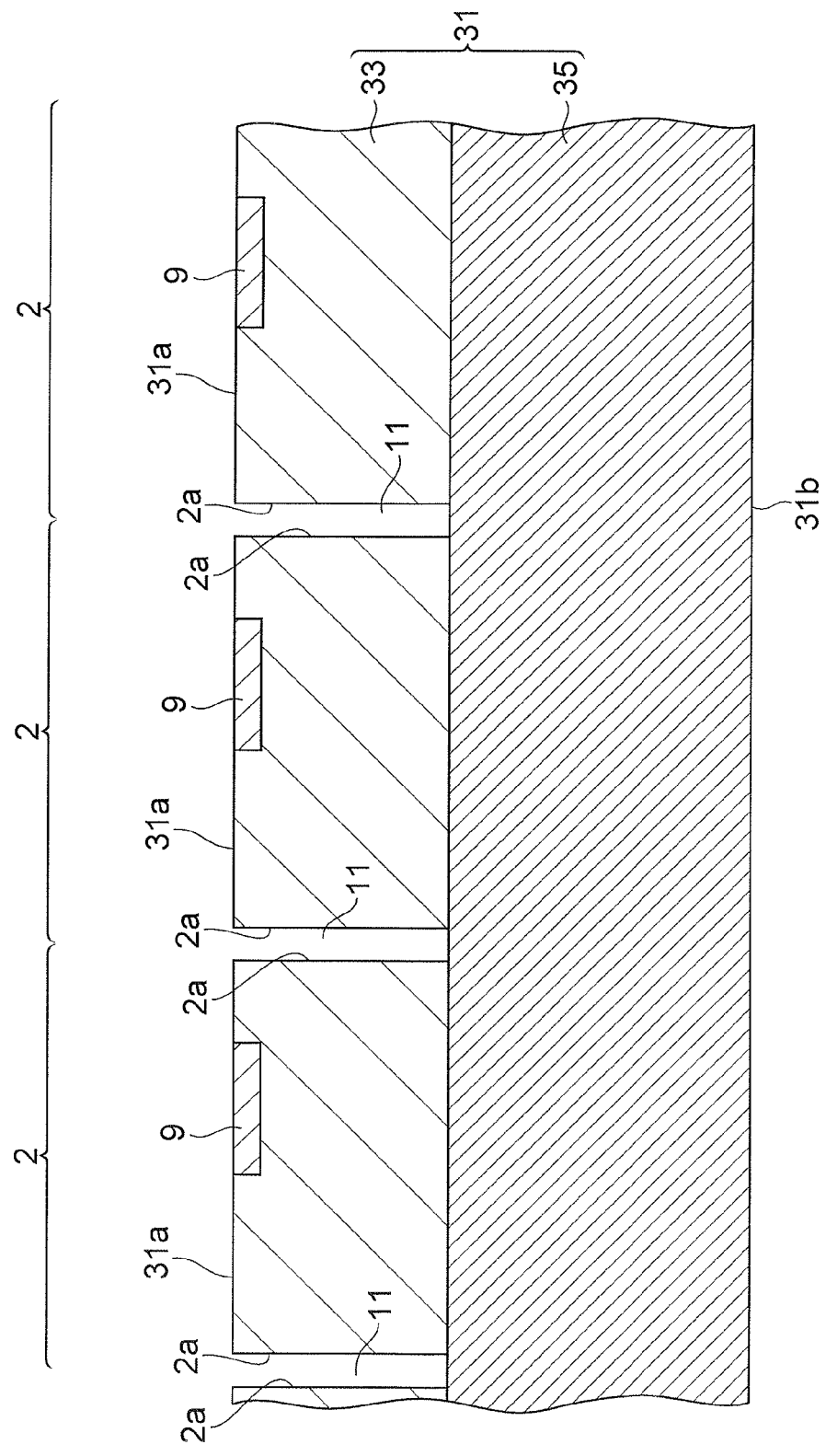
FIG. 22 is a drawing for explaining the manufacturing process for edge illuminated type photodiodes according to the second embodiment.
Figure 23:
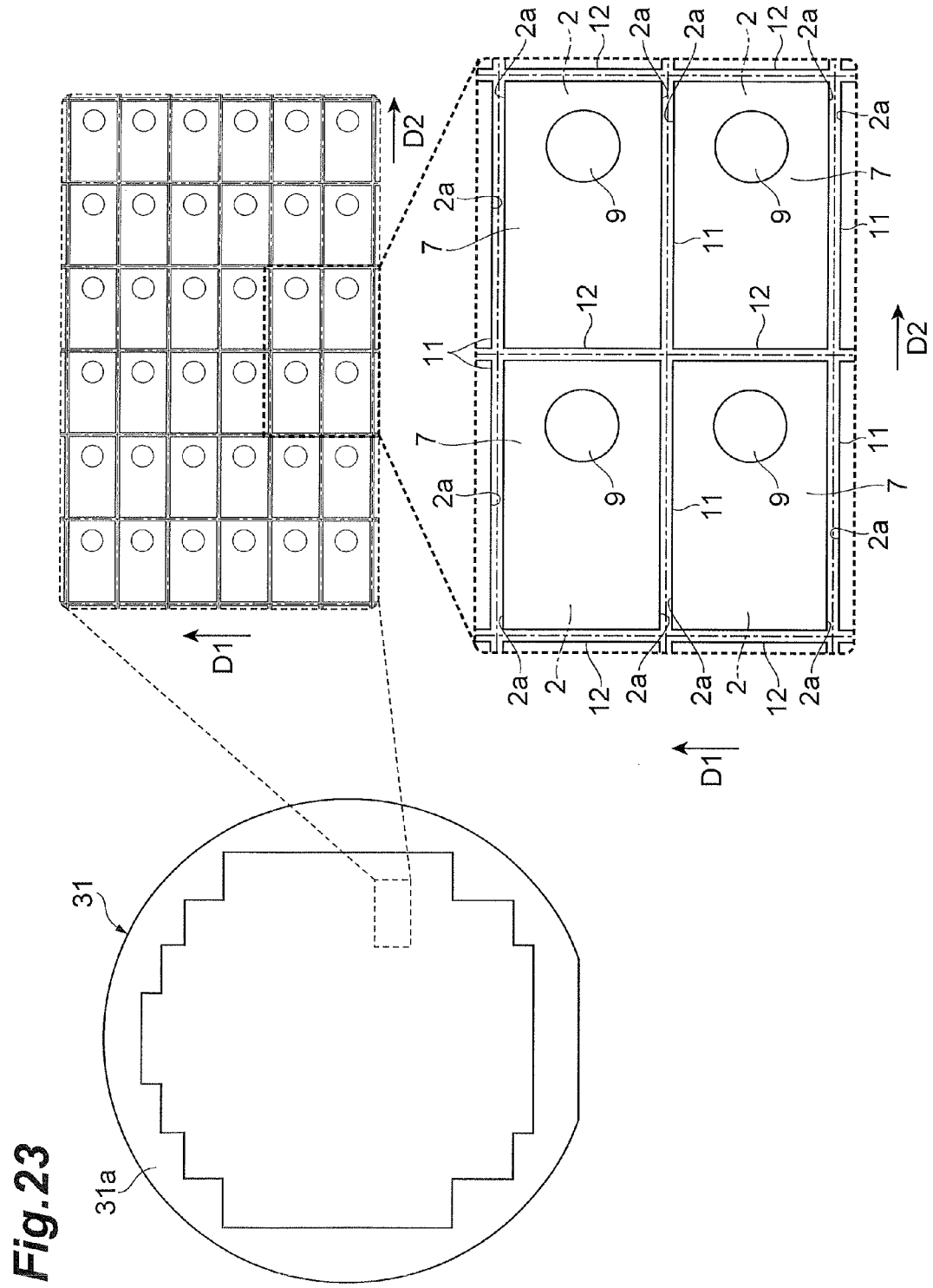
FIG. 23 is a drawing for explaining the manufacturing process for edge illuminated type photodiodes according to the second embodiment.

Next, the trenches 11, 12 are formed from the principal surface 31a, at positions of boundaries between adjacent device forming regions 2 out of the plurality of device forming regions 2 (cf. FIGS. 22 and 23). This process results in exposing the side faces 2a of each device forming region 2 and also exposing the faces (end faces) perpendicular to the side faces 2a. The trenches 11, 12 are formed in the semiconductor substrate 31 by etching in the same manner as in the first embodiment. The trenches 11 are formed so as to extend in the direction (second direction D2) perpendicular to the first direction D1, at the positions of the boundaries between the device forming regions 2 adjacent to each other in the first direction D1. The trenches 12 are formed so as to extend in the direction (first direction D1) perpendicular to the second direction D2, at the positions of the boundaries between the device forming regions 2 adjacent to each other in the second direction D2. The trenches 11 and the trenches 12 are continuous at positions where they intersect with each other.

The direction of depth of the trenches 12 is also the direction of thickness of the semiconductor substrate 31 as that of the trenches 11 is. The depth of the trenches 11, 12 is set to a value smaller than the thickness of the semiconductor substrate 31. In the present embodiment, the trenches 11, 12 are formed so as not to penetrate through the semiconductor substrate 31 and the depth thereof is the same value as the thickness of the first substrate region 33. When viewed from the direction perpendicular to the principal surface 31a, the trenches 11, 12 are formed in a lattice pattern so as to define the first substrate region 33 of each device forming region 2.

Figure 24:
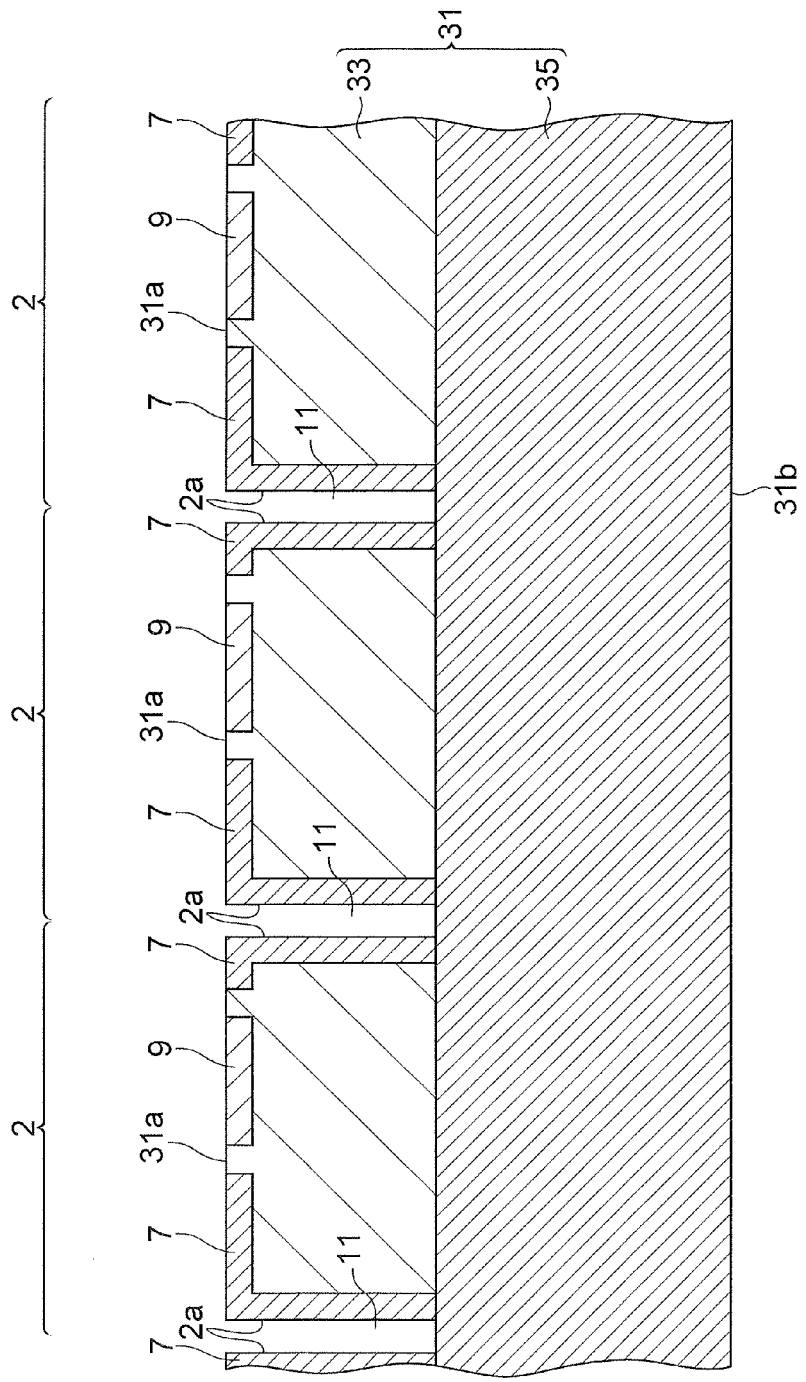
FIG. 24 is a drawing for explaining the manufacturing process for edge illuminated type photodiodes according to the second embodiment.

Next, a plurality of impurity-doped layers 7 of the first conductivity type (e.g., n-type) are formed on the semiconductor substrate 31 (first substrate region 33) (cf. FIG. 24). Each impurity-doped layer 7 is formed so as to be continuous to the second substrate region 35, along the inside faces defining the trenches 11, 12 from the principal surface 31a side of the semiconductor substrate 31 (first substrate region 33). Namely, the impurity-doped layer 7 has a portion located on the principal surface 31a side of the first substrate region 33, and a portion located along the inside faces defining the trenches 11, 12, and the portions are continuous. The impurity-doped layer 7 is formed so as to extend across the side faces and the end faces of the first substrate region 33 in each device forming region 2. This configuration prevents the pn junction from being exposed, which suppresses generation of noise. The impurity-doped layers 7 are regions doped with an impurity of the first conductivity type and have a higher impurity concentration than the first substrate region 33. The impurity of the first conductivity type can be added in the first substrate region 33 by the ion doping process or by the ion implantation process.

Figure 25:
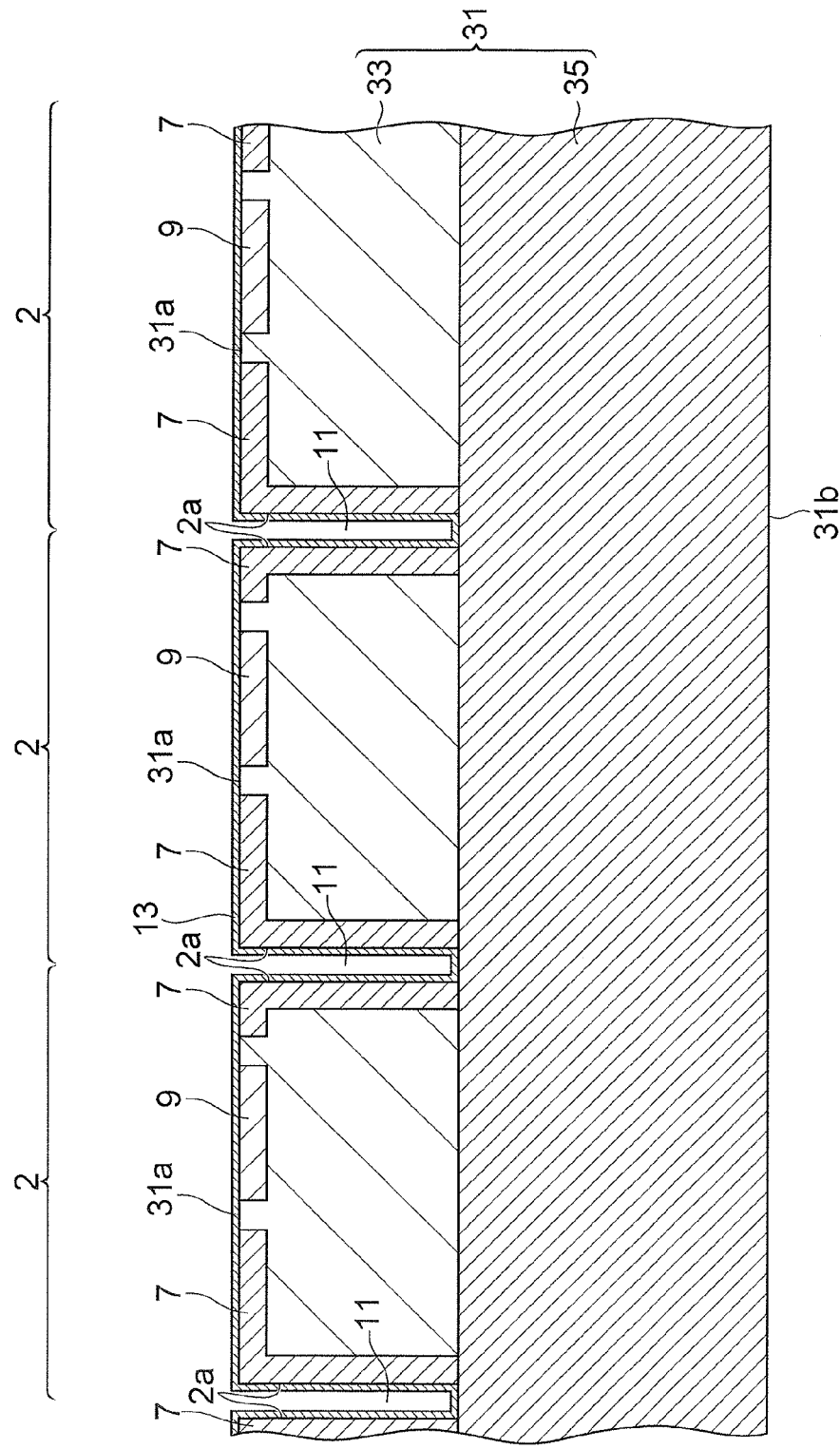
FIG. 25 is a drawing for explaining the manufacturing process for edge illuminated type photodiodes according to the second embodiment.

Next, an insulating film 13 functioning as an antireflection film is formed on the semiconductor substrate 31 (cf. FIG. 25). The insulating film 13 is formed so as to cover the principal surface 31a of the semiconductor substrate 31 and the inside faces defining the trenches 11, 12, on the principal surface 31a side of the semiconductor substrate 31 as in the first embodiment. Through this process, the exposed side faces 2a of the device forming regions 2 become covered by the insulating film 13.

Figure 26:
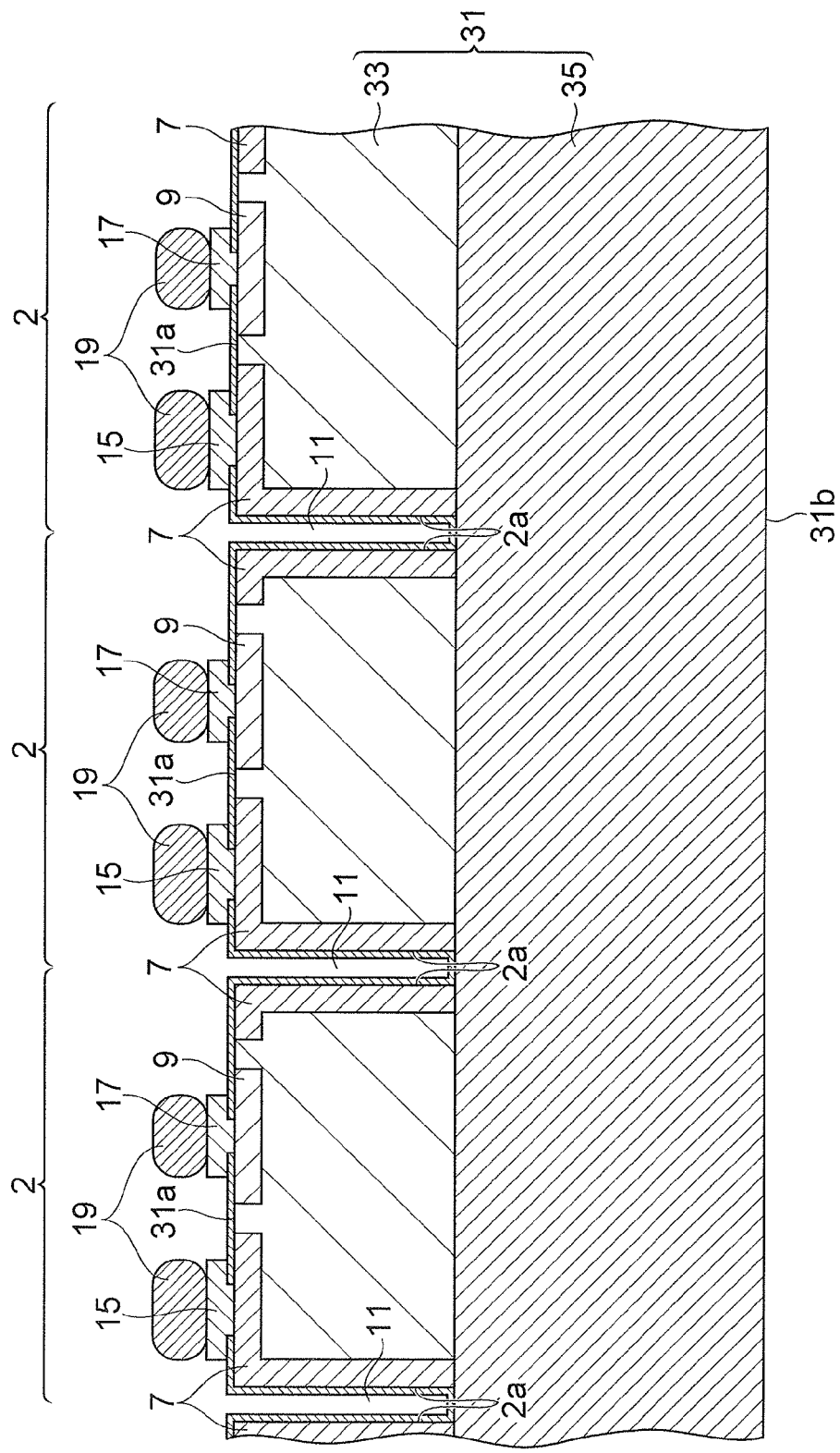
FIG. 26 is a drawing for explaining the manufacturing process for edge illuminated type photodiodes according to the second embodiment.

Next, as in the first embodiment, the electrodes 15, 17 are formed on the principal surface 31a side of the semiconductor substrate 31 and thereafter the solder bumps 19 are formed on the respective electrodes 15, 17 (cf. FIG. 26).

Figure 27:
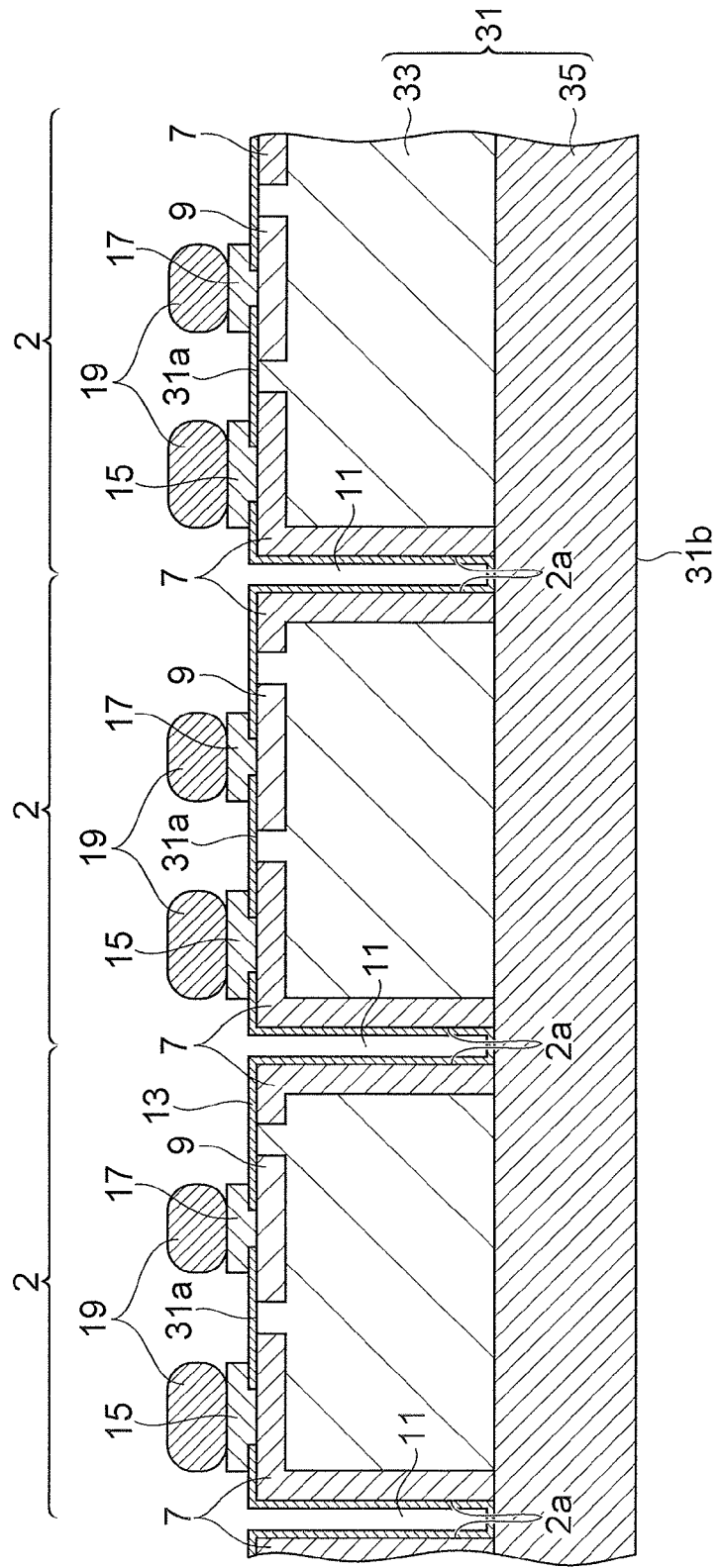
FIG. 27 is a drawing for explaining the manufacturing process for edge illuminated type photodiodes according to the second embodiment.

Next, the semiconductor substrate 31 is thinned from the principal surface 31b side (cf. FIG. 27). In the present embodiment, the second substrate region 35 of the semiconductor substrate 31 is thinned. The thinning of the second substrate region 35 (semiconductor substrate 31) is carried out, for example, by dry etching or by mechanical polishing as in the first embodiment.

Figure 28:
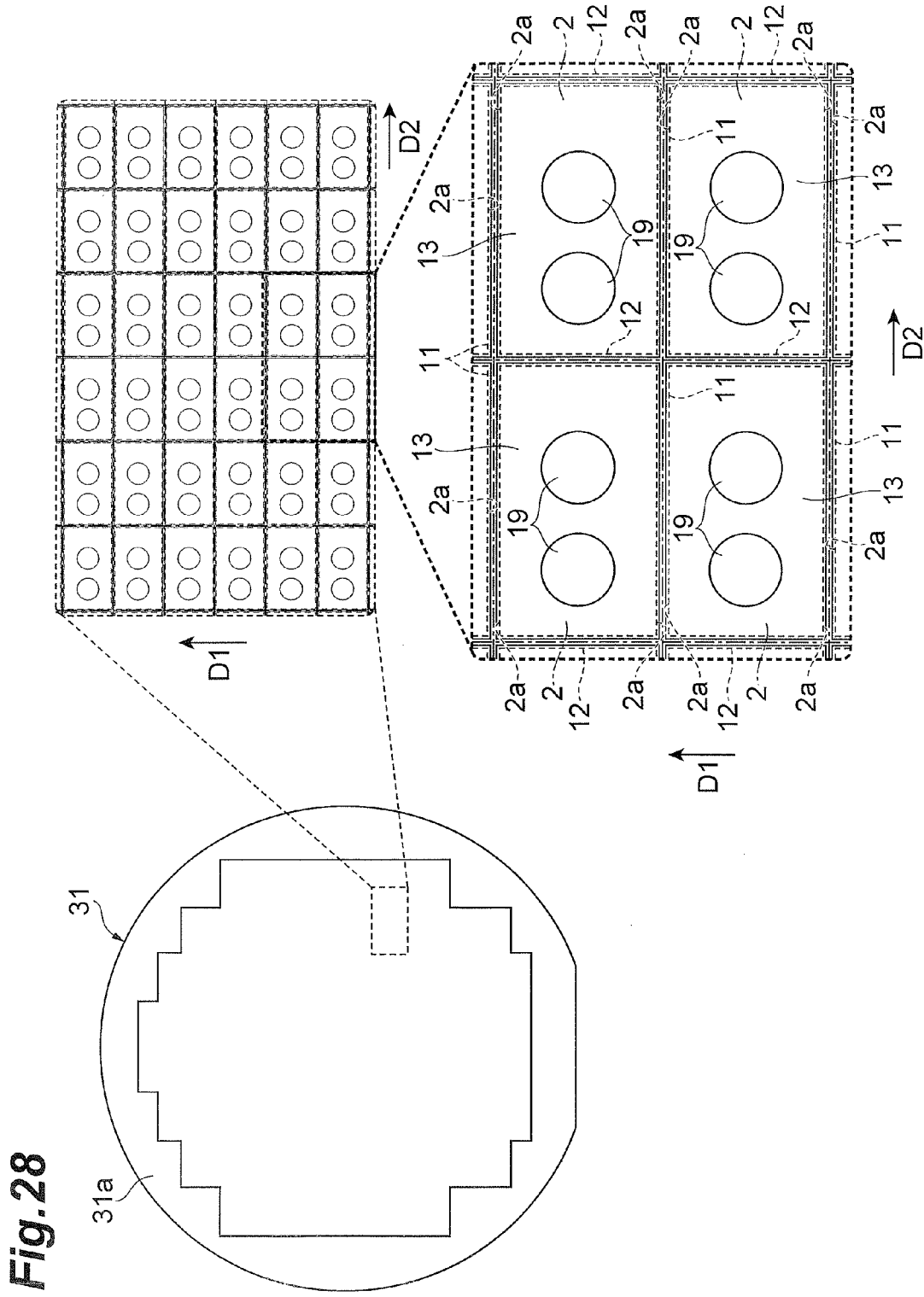
FIG. 28 is a drawing for explaining the manufacturing process for edge illuminated type photodiodes according to the second embodiment.

The semiconductor substrate 31 (semiconductor wafer) obtained through the above process is provided with the impurity-doped layers 7, 9 formed in the respective device forming regions 2, and the electrodes 15, 17 formed corresponding to the respective impurity-doped layers 7, 9, on the principal surface 31a side of the semiconductor substrate 31, as shown in FIGS. 27 and 28. In the semiconductor substrate 31, the trenches 11, 12 extending in the thickness direction of the semiconductor substrate 31 from the principal surface 31a are formed by etching at the positions of the boundaries between adjacent device forming regions 2 so as to expose the side faces 2a of each device forming region 2. The insulating film 13 is formed on the exposed side faces 2a of the device forming regions 2.

Figure 29:
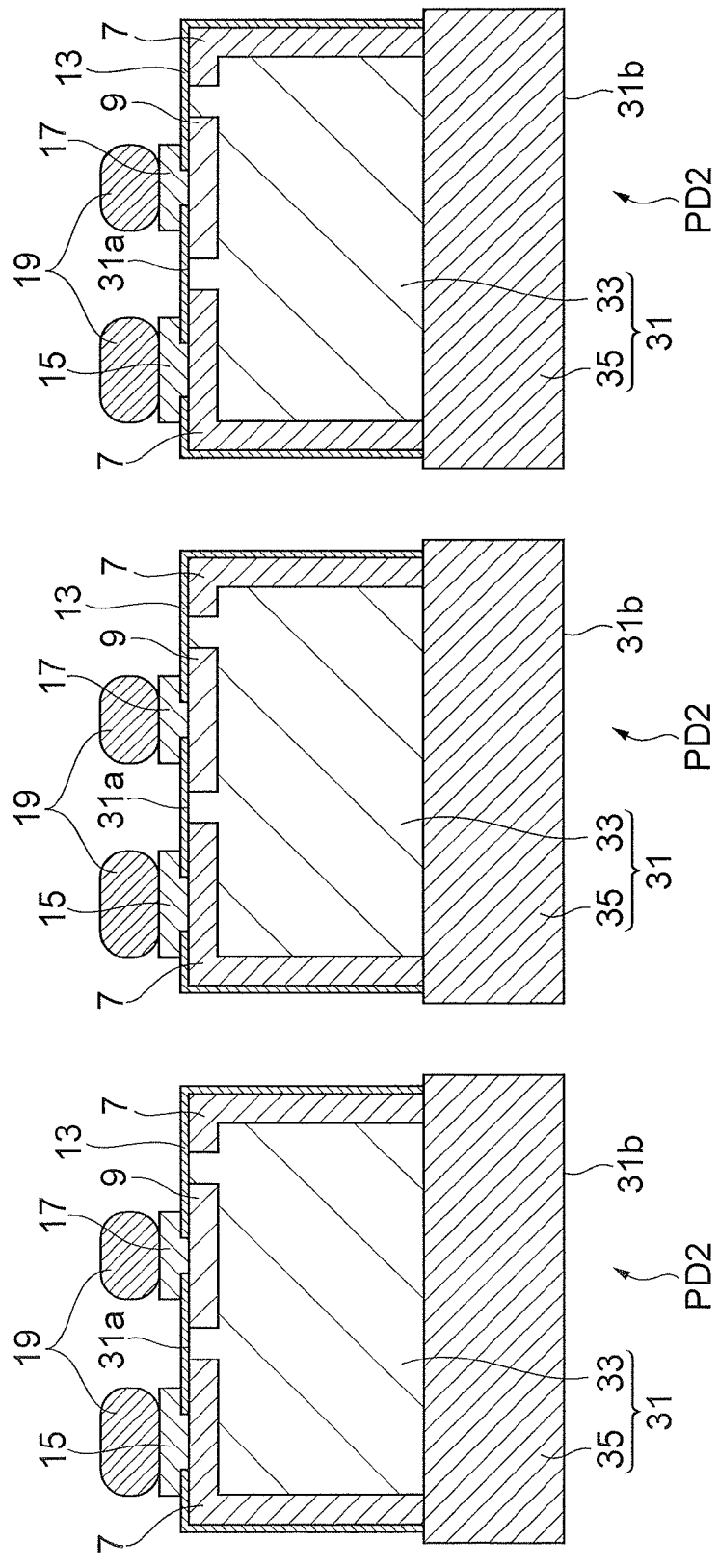
FIG. 29 is a drawing for explaining the manufacturing process for edge illuminated type photodiodes according to the second embodiment.

Next, the semiconductor substrate 31 is singulated into the individual device forming regions 2 (cf. FIG. 29). This process results in obtaining the edge illuminated type photodiodes PD2. The singulation of the semiconductor substrate 31 is implemented by the stealth dicing technology as in the first embodiment.

In the edge illuminated type photodiode PD2, the side face of the first substrate region 33 (the inside face defining the trench 11 in the semiconductor substrate 31) is defined as a light incident surface. The pn junction formed between the first substrate region 33 and the impurity-doped layer 7 is also located on the side of the side face defined as the light incident surface (the inside face defining the trench 11 in the semiconductor substrate 31), as well as on the principal surface 31a side of the first substrate region 33. For this reason, the distance of migration of carriers generated with incidence of light to the pn junction (travel distance of carriers) is short and the time necessary for the carriers to reach the pn junction is short. This allows the photodiode PD2 to increase its response speed.

Since in the photodiode PD2 the side face defined as the light incident surface is also formed by dry etching as described above, the surface thereof is extremely smoother than the surface formed by dicing. Therefore, the photodiode PD2 can also successfully detect the light in the relatively short wavelength region as the photodiode PD1 can.

In the present embodiment, as in the modification example of the first embodiment, the protective film may also be formed on the semiconductor substrate 31, before thinning the semiconductor substrate 31 (semiconductor wafer) from the principal surface 31b side. This protective film is removed after the thinning of the semiconductor substrate 31.

The above described the preferred embodiments of the present invention, but it should be noted that the present invention is not always limited to the above embodiments and can be modified in many ways without departing from the spirit and scope of the invention.

The technique of singulation of the semiconductor substrate 1, 31 is not limited to the stealth dicing technology. The singulation of the semiconductor substrate 1, 31 may also be implemented, for example, by laser ablation, dry etching, or mechanical polishing.

In the first embodiment, the trenches 11 formed in the semiconductor substrate 1 (semiconductor wafer) may be formed so as to penetrate through the semiconductor substrate 1. When the trenches 11 are formed so as to penetrate through the semiconductor substrate 1, the mechanical strength of the semiconductor substrate 1 could decrease. Therefore, the trenches 11 are preferably formed so as not to penetrate through the semiconductor substrate 1, in order to ensure the mechanical strength of the semiconductor substrate 1.

In the first embodiment, the trenches 11 formed in the semiconductor substrate 1 (semiconductor wafer) may be continuously formed across a plurality of device forming regions 2. When the trenches 11 are continuously formed across a plurality of device forming regions 2, the mechanical strength of the semiconductor substrate 1 could decrease. Therefore, the trenches 11 are preferably formed in the respective corresponding device forming regions 2 so as to be physically separated from each other, in order to ensure the mechanical strength of the semiconductor substrate 1.

In the first embodiment, the trenches 11 may be formed at the positions of the boundaries between the device forming regions 2 adjacent to each other in the second direction D2. However, since the mechanical strength of the semiconductor substrate 1 could decrease, the trenches 11 are preferably not formed at the positions of the boundaries between the device forming regions 2 adjacent to each other in the second direction D2.

The arrangement of the device forming regions 2 in the semiconductor substrate 1, 31 does not have to be limited to the aforementioned arrangement. The arrangement of the device forming regions 2 may have a relative shift in the first direction D1, for example, between a column of device forming regions 2 aligned in the first direction D1 and a column of device forming regions 2 located next to the foregoing column in the second direction D2 and aligned in the first direction D1. In this case, the first direction D1 and the second direction D2 are not perpendicular to each other.

The semiconductor substrate 1, 31 does not always have to be thinned before the singulation of the semiconductor substrate 1, 31 (semiconductor wafer). The semiconductor substrate (semiconductor wafer) 1, 31 may not be thinned depending upon the thickness of the semiconductor substrate 1, 31.

The numbers of impurity-doped layers 7, 9 (electrodes 15, 17 and solder bumps 19) do not have to be limited to those disclosed in the drawings. For example, the number of impurity-doped layer 9 (electrode 17 and solder bump 19) may be two or more, and the number of impurity-doped layer 7 (electrode 15 and solder bump 19) may be two or more.

The insulating film 13 does not always have to be formed on the principal surface 1a, 31a of the semiconductor substrate 1, 31. It is sufficient to form the insulating film 13 at least on the regions corresponding to the side faces 2a of the device forming regions 2.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A semiconductor wafer including a plurality of device forming regions and having first and second principal surfaces opposed to each other, said semiconductor wafer comprising:

an impurity-doped layer of a first conductivity type formed in each of the device forming regions;

an impurity-doped layer of a second conductivity type formed in each of the device forming regions; and an electrode formed corresponding to each said impurity-doped layer, on the first principal surface side of the semiconductor wafer, wherein a trench extending in a direction of thickness of the semiconductor wafer from the first principal surface is formed by etching, at a position of a boundary between adjacent device forming regions out of the plurality of device forming regions, so as to expose side faces of the device forming regions, and wherein an insulating film is formed on the exposed side faces of the device forming regions.

2. The semiconductor wafer according to claim 1,
wherein the trench is formed so as to extend in a direction perpendicular to a first direction, at a position of a boundary between device forming regions adjacent to each other in the first direction out of the plurality of device forming regions, and wherein no trench is formed at a position of a boundary between device forming regions adjacent to each other in a second direction intersecting with the first direction out of the plurality of device forming regions.

3. The semiconductor wafer according to claim 2,
wherein the trench is formed in each corresponding said device forming region so as to be physically separated from other trenches.

* * * * *